United States Patent
Setta

(10) Patent No.: US 7,659,040 B2
(45) Date of Patent: Feb. 9, 2010

(54) EXPOSURE MASK AND METHOD OF MANUFACTURING THE SAME, AND SEMICONDUCTOR DEVICE MANUFACTURING METHOD

(75) Inventor: Yuji Setta, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 622 days.

(21) Appl. No.: 11/214,891

(22) Filed: Aug. 31, 2005

(65) Prior Publication Data

US 2006/0269848 A1 Nov. 30, 2006

(30) Foreign Application Priority Data

May 31, 2005 (JP) .............................. 2005-159077

(51) Int. Cl.
*G03F 1/00* (2006.01)
(52) U.S. Cl. .......................................... 430/5; 430/311
(58) Field of Classification Search ...................... 430/5, 430/30, 311, 322; 716/19, 21
See application file for complete search history.

(56) References Cited

U.S. PATENT DOCUMENTS

| | | | | |
|---|---|---|---|---|
| 5,436,095 A | * | 7/1995 | Mizuno et al. | 430/5 |
| 5,700,601 A | | 12/1997 | Hasegawa et al. | |
| 5,725,971 A | * | 3/1998 | Moriuchi et al. | 430/5 |
| 5,895,741 A | | 4/1999 | Hasegawa et al. | |
| 6,335,151 B1 | * | 1/2002 | Ausschnitt et al. | 430/322 |
| 6,686,108 B2 | | 2/2004 | Inoue et al. | |
| 2004/0166422 A1 | * | 8/2004 | Yamazoe et al. | 430/5 |
| 2005/0136336 A1 | * | 6/2005 | Schacht et al. | 430/5 |
| 2006/0154152 A1 | * | 7/2006 | Chandhok | 430/5 |

FOREIGN PATENT DOCUMENTS

| | | |
|---|---|---|
| JP | 6-083031 A | 3/1994 |
| JP | 7-271013 A | 10/1995 |
| JP | 8-76355 | 3/1996 |
| JP | 2002-122976 | 4/2002 |

OTHER PUBLICATIONS

"Japanese Office Action", Partial English-language translation, mailed Mar. 31, 2009 from JP Patent Office for corresponding JP App. No. 2005-159077.

* cited by examiner

*Primary Examiner*—Mark F Huff
*Assistant Examiner*—Stewart A Fraser
(74) *Attorney, Agent, or Firm*—Fujitsu Patent Center

(57) ABSTRACT

An exposure mask 24, includes a quartz (transparent) substrate 20, a film 21 formed on the quartz substrate 20, a rectangular main feature 21a formed in the film 21, a first assist feature 21b formed in the film 21 away from the main feature 21a and having a size that is not resolved as a rectangle that has a long side 21e opposing to one side 21d of the main feature 21d, and a second assist feature 21c formed in the film 21 and positioned on a virtual prolonged line L of a diagonal of the main feature 21a and having a size that is not resolved.

11 Claims, 29 Drawing Sheets

Best Focus position (nm)

$W_a = W_b$

Defocus $W_a > W_b$

6

EXPOSURE MASK AND METHOD OF MANUFACTURING THE SAME, AND SEMICONDUCTOR DEVICE MANUFACTURING METHOD

CROSS-REFERENCE TO RELATED APPLICATIONS

This application is based on and claims priority of Japanese Patent Application No. 2005-159077 filed on May 31, 2005, the entire contents of which are incorporated herein by reference.

BACKGROUND OF THE INVENTION

1. Field of the Invention

The present invention relates to an exposure mask and a method of manufacturing the same, and a semiconductor device manufacturing method.

2. Description of the Related Art

Demand for miniaturization of the semiconductor device, such as LSI, is continually strengthened. As a result, device pattern, such as contact hole, is required to have a narrower line width than the wave length of the exposure light used in a exposure equipment. In order to meet such requirement, the illumination that has a high resolution and is suitable for a fine device pattern, e.g., the annular illumination such as the oblique incidence, is employed in the exposure equipment such as the stepper, and the exposure mask to which the optical proximity correction (OPC) is applied is used in the exposure equipment.

Although the annular illumination has a function of enhancing the resolution power as described above, it has such a drawback that an enough depth of focus cannot be gained at the particular pattern pitch. Some technologies for overcoming this problem are known in the art, including the method disclosed in Patent Literature 1.

In Patent Literature 1, an assist feature (opening), called an assist pattern, is formed in the exposure mask as well as the main feature for projecting a device pattern, thereby supplementing the depth of focus that tends to be insufficient at the main feature.

[Patent Literature 1] Patent Application Publication (KOKAI) 2002-122976

SUMMARY OF THE INVENTION

According to an aspect of the present invention, there is provided an exposure mask, which includes a transparent substrate; a film formed on the transparent substrate; a rectangular main feature formed in the film; a first assist feature formed in the film at a distance from the main feature, the first assist feature being rectangular shape having a long side opposing to one side of the main feature and having a size that is not resolved as a device pattern; and a second assist feature formed in the film and positioned on a virtual prolonged line of a diagonal of the main feature, and having a size that is not resolved as a device pattern.

According to the exposure mask of the present invention, in addition to the main feature corresponding to the device pattern, the first and second assist features is formed in the film on the transparent substrate, for the purpose of deepening the depth of focus of the main feature. According to the investigation performed by the present inventor, it is verified that the depth of focus of the exposure mask can be made deeper than the case where the first assist feature has a square planer shape, by shaping the planer shape of the first assist feature into the rectangle whose long side opposes to one side of the main feature. Furthermore, it is also verified that the depth of focus of the exposure mask can be much more deepened by arranging the second assist feature at the oblique position of the main feature, that is, on the virtual prolonged line of the diagonal of the main feature.

As a result of these feature, present invention can increase the focus margin of the exposure equipment, thereby preventing the resist pattern size from deviating the design value even when focus shift occurs in the exposure equipment. As a result, present invention can prevent the semiconductor device from being defective, which in turn increases a yield of the semiconductor device.

According to another aspect of the present invention, there is provided an exposure mask manufacturing method, which includes a step of acquiring design data of a main feature by applying a process, which extends four sides of a rectangular device pattern, to design data of the device pattern; a step of acquiring design data of a first assist feature with a rectangular shape that has a long side, which is located in parallel with one side of the main feature and has a same length as the one side, in a position opposing to the one side; a step of acquiring design data of a second assist feature that is positioned on a virtual prolonged line of a diagonal of the main feature; and a step of forming the main feature, the first assist feature, and the second assist feature in a film on a transparent substrate respectively by patterning the film by means of a lithography using design data of the main feature, the first assist feature, and the second assist feature.

In the present invention, since four sides of the device pattern are extended, a long side of the first assist feature can be generated on the basis of the extended side. Therefore, design data of the first assist feature with a rectangular shape that is effective in deepening the depth of focus of the exposure mask can be easily acquired.

Also, it is preferable that the step of acquiring design data of a second assist feature includes a step of forming a rectangular frame whose center is located in the main feature, and a step of arranging a small rectangle, which has one vertex in common with the rectangular frame, in an inner side of the rectangular frame and then acquiring position data and shape data of the small rectangle as the design data of the second assist feature.

By forming the rectangular frame in this manner and acquiring design data of the second assist feature with the help of the rectangular frame, the second assist feature can be easily arranged on the virtual prolonged line of the diagonal of the main feature.

In addition, it is preferable that, in the step of arranging the small rectangle in the inner side of the rectangular frame, a size of the small rectangle serving as the second assist feature is allowed to be modified.

According to this, out of the small rectangles of various sizes, the small rectangle that can mostly deepen the depth of focus of the exposure mask can be formed as the second assist feature. Therefore, an effect of increase in the depth of focus by using the second assist feature can be achieved maximally.

According to still another aspect of the present invention, there is provided a semiconductor device manufacturing method, which includes a step of forming a device pattern film on a semiconductor substrate; a step of coating a photoresist on the device pattern film; a step of exposing the photoresist by using an exposure mask, the exposure mask being composed of a transparent substrate, a film formed on the transparent substrate, a rectangular main feature formed in the film, a first assist feature formed in the film at a distance from the main feature and being rectangular shape having a long side opposing to one side of the main feature and having a size that is not resolved as a device pattern, and a second assist feature formed in the film and positioned on a virtual prolonged line of a diagonal of the main feature and having a size that is not resolved as a device pattern; a step of forming a resist pattern by developing the photoresist after the exposure; and a step of forming a device pattern by patterning the device pattern film, by etching the device pattern film while using the resist pattern as a mask.

According to the semiconductor device manufacturing method of the present invention, the photoresist is exposed by using the exposure mask, whose depth of focus is deepened by the first and second assist feature. Therefore, even when the defocus is generated by an error in the exposure equipment or the warp of the semiconductor substrate in the step of exposing the photoresist, the projected image of the main feature in the exposure mask is not largely varied. As a result, it can be prevented that a size of the device pattern formed by using the photoresist as an etching mask from being largely deviated from a design value, and thus it can be prevented that the resultant semiconductor device becomes defective.

DESCRIPTION OF THE PREFERRED EMBODIMENTS (1) Preliminary Explanation

Prior to the explanation of embodiments of the present invention, preliminary matters of the present invention will be explained hereunder.

In the semiconductor device such as the logic LSI, or the like, it is rarely the case that the device patterns such as the wirings, etc. are arranged uniformly in one chip. Normally a density of the patterns is changed variously in one chip. As one of indices representing the density of the patterns, there is a pattern occupation rate that is defined by an area of device patterns in a partial region by an area of the region. This occupation rate exerts an influence on the depth of focus of the exposure equipment such as the stepper, or the like. In particular, the oblique incidence illumination has such a tendency that the depth of focus is reduced in the portion where the occupation rate is small, i.e., in the coarse pattern.

Figure 1:
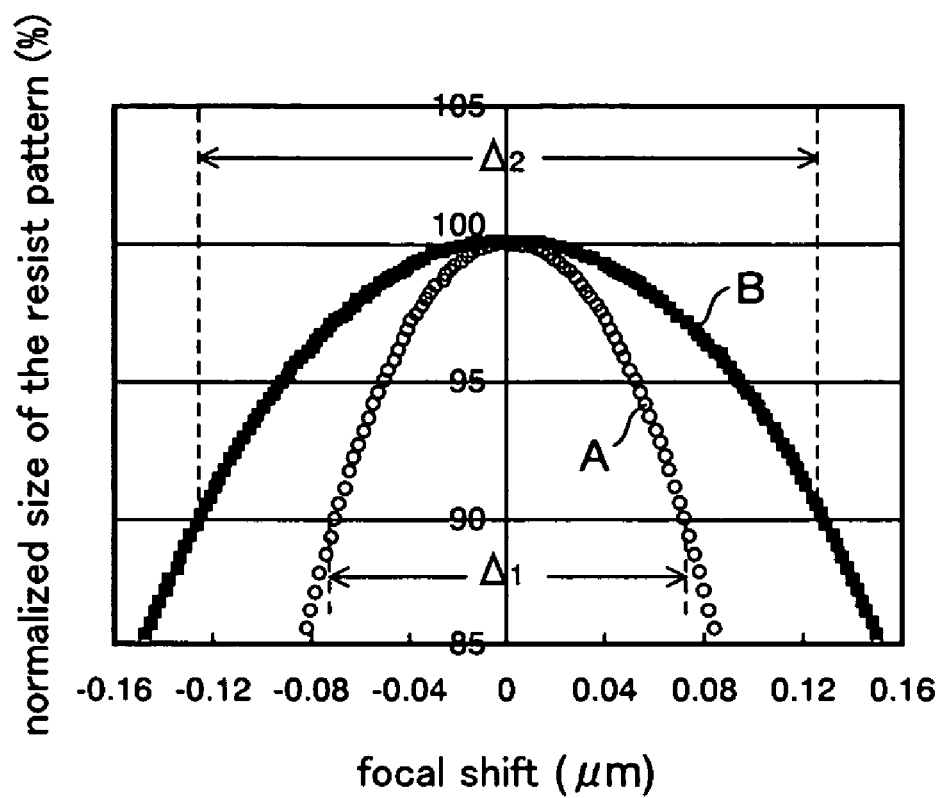
FIG. 1 is a view showing CD-FOCUS curves of a dense pattern and a coarse pattern.
Figure 2:
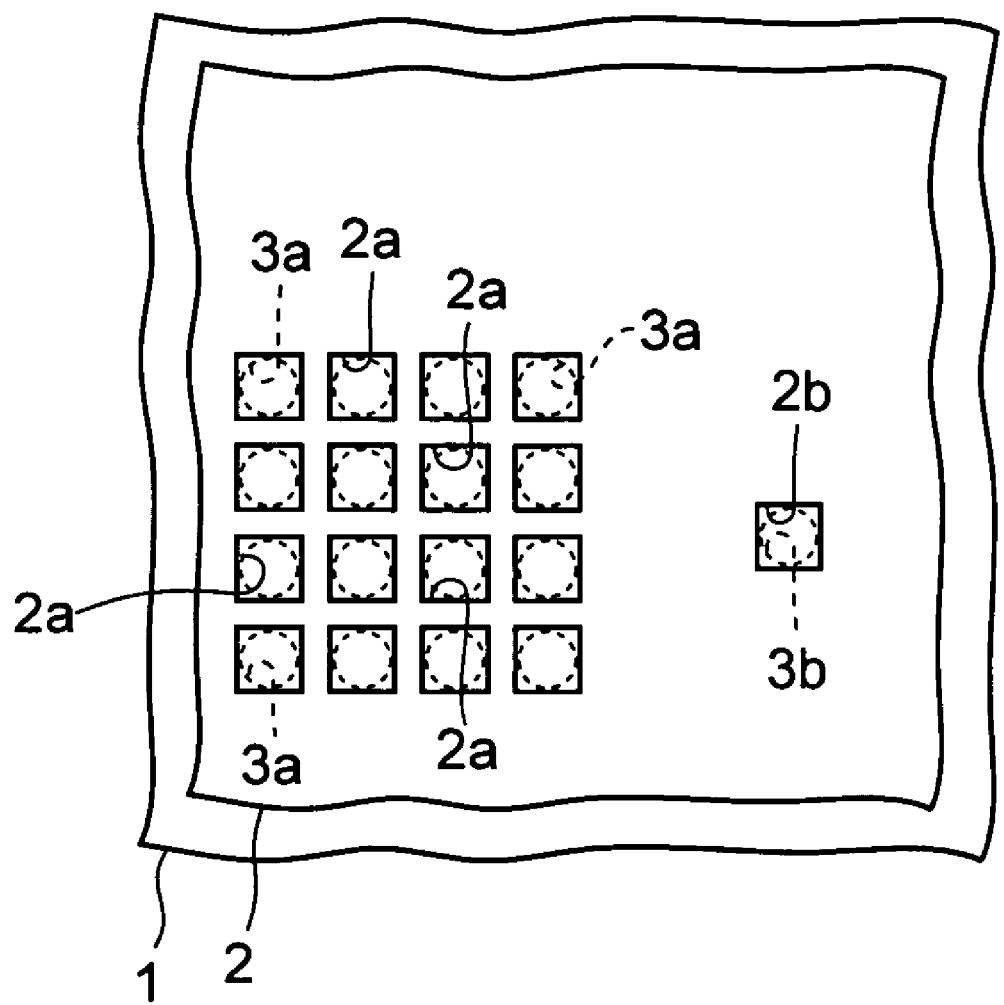
FIG. 2 is an enlarged sectional view of an exposure mask used to get the CD-FOCUS curves in FIG. 1.

FIG. 1 is a view showing CD-FOCUS curves A, B of the dense pattern and the coarse pattern, and FIG. 2 is an enlarged plan view of the exposure mask used to get the CD-FOCUS curves in FIG. 1.

An abscissa of FIG. 1 denotes a focal shift at the time of exposure, and the best focus without the focal shift is given at a position where a value of the focal shift is 0. Also, an ordinate of FIG. 1 denotes a size of the resist pattern obtained by developing the exposed resist, and this size is normalized by a value at the best focus.

Also, as shown in FIG. 2, the exposure mask is constructed by forming a light shielding film 2 on a quartz substrate 1 and then forming dense features 2a and a course feature 2b in the light shielding film 2.

It should be noted that the term "feature" is used in this specification for the meaning of "opening".

Windows 3a, 3b indicated by a dotted line in FIG. 2 show schematically the windows of the resist pattern, which are obtained by projecting respective images of these features 2a, 2b onto the resist and then developing the resist. At this time, the size of the resist pattern in FIG. 1 is meant to a diameter of respective windows 3a, 3b.

As apparent from FIG. 1, it is understood that, in contrast to the CD-FOCUS curve B of the dense features 2a, the size of the resist pattern (diameter of the window) in the CD-FOCUS curve A of the course feature 2b is sharply narrowed as the focal shift is increased and thus a depth of focus $\Delta_1$ becomes shallow. Here, the "depth of focus" used in this specification signifies a width of the focal shift, within which the size of the resist pattern is contained at a particular rate or more, e.g., 90% or more. As understood from the curve B, a depth of focus $\Delta_2$ of the dense features 2a becomes large rather than that of the course feature 2b.

Figure 3:
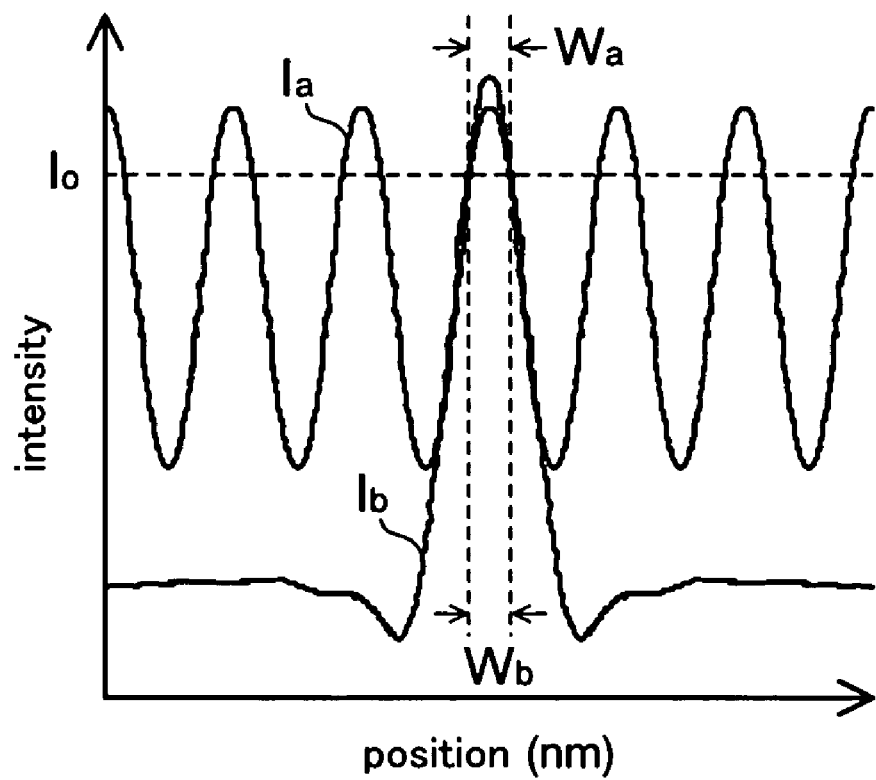
FIG. 3 is a view showing a light intensity distribution of dense features and coarse features in a best focus state respectively.
Figure 4:
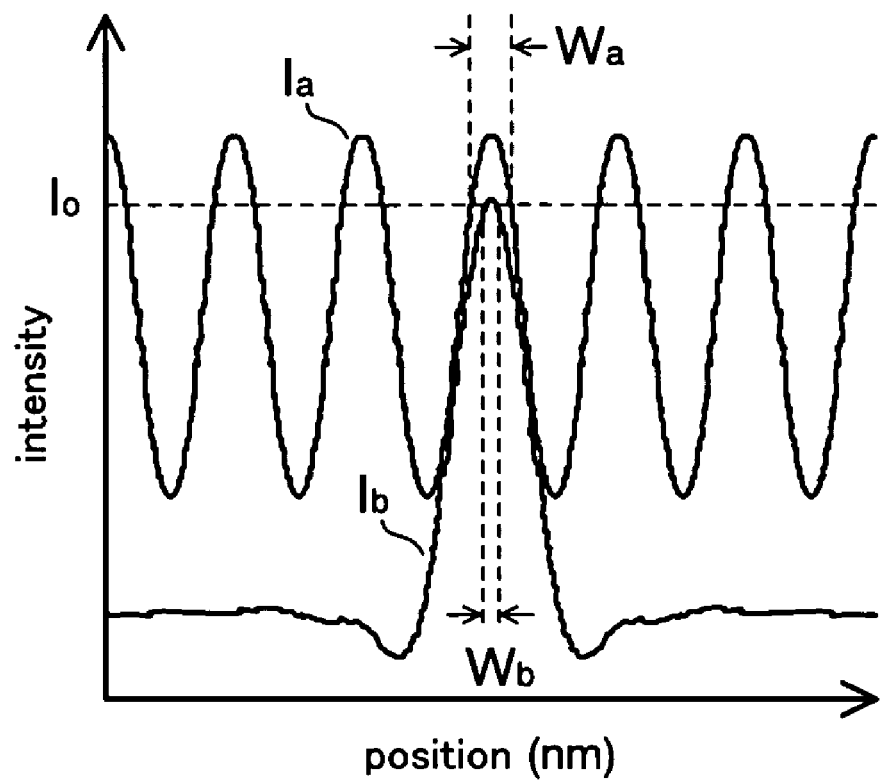
FIG. 4 is a view showing a light intensity distribution of dense features and coarse features in a defocus state respectively.

FIG. 3 and FIG. 4 are views showing a light intensity distribution of the projected images of respective features 2a, 2b on a silicon substrate (not shown). FIG. 3 shows the light intensity distribution in the best focus state, and FIG. 4 shows the light intensity distribution in the defocus state. Also, an abscissa in FIG. 3 and FIG. 4 denotes a position on the silicon substrate, and an ordinate denotes an intensity of the exposure light. Also, in these Figures, a curve indicated by $I_a$ gives the light intensity distribution of the dense features 2a, and a curve indicated by $I_b$ gives the light intensity distribution of the course feature 2b.

In order to resolve the latent image in the photoresist after the photoresist coated on the silicon substrate is exposed and developed, the exposure light having an intensity that is in excess of a critical value $I_o$ is needed. Therefore, when the resist pattern is formed by developing the photoresist that is exposed at a light intensity shown in FIG. 3, the latent images corresponding to the features 2a, 2b are formed in the resist pattern as the windows having widths $W_a$, $W_b$ respectively.

In the best focus state in FIG. 3, the influence of a difference in the depth of focus between the features 2a, 2b on the widths $W_a$, $W_b$ is small, and thus $W_a = W_b$ is substantially satisfied.

In contrast, in the defocus (focal shift) state in FIG. 4, the light intensity $I_b$ of the coarse feature 2b is largely lowered rather than that of the dense features 2a, due to the fact that the depth of focus of the course feature 2b is shallower than that of the dense features 2a. As a result, the width $W_b$ of the window in the resist pattern corresponding to the course feature 2b is narrower than the width $W_a$ of the window in the resist pattern corresponding to the dense features 2a, so that the size of the device pattern formed by using the resist pattern as an etching mask is out of the designed value, and thus there is a possibility that the semiconductor device may be degraded.

Figure 5:
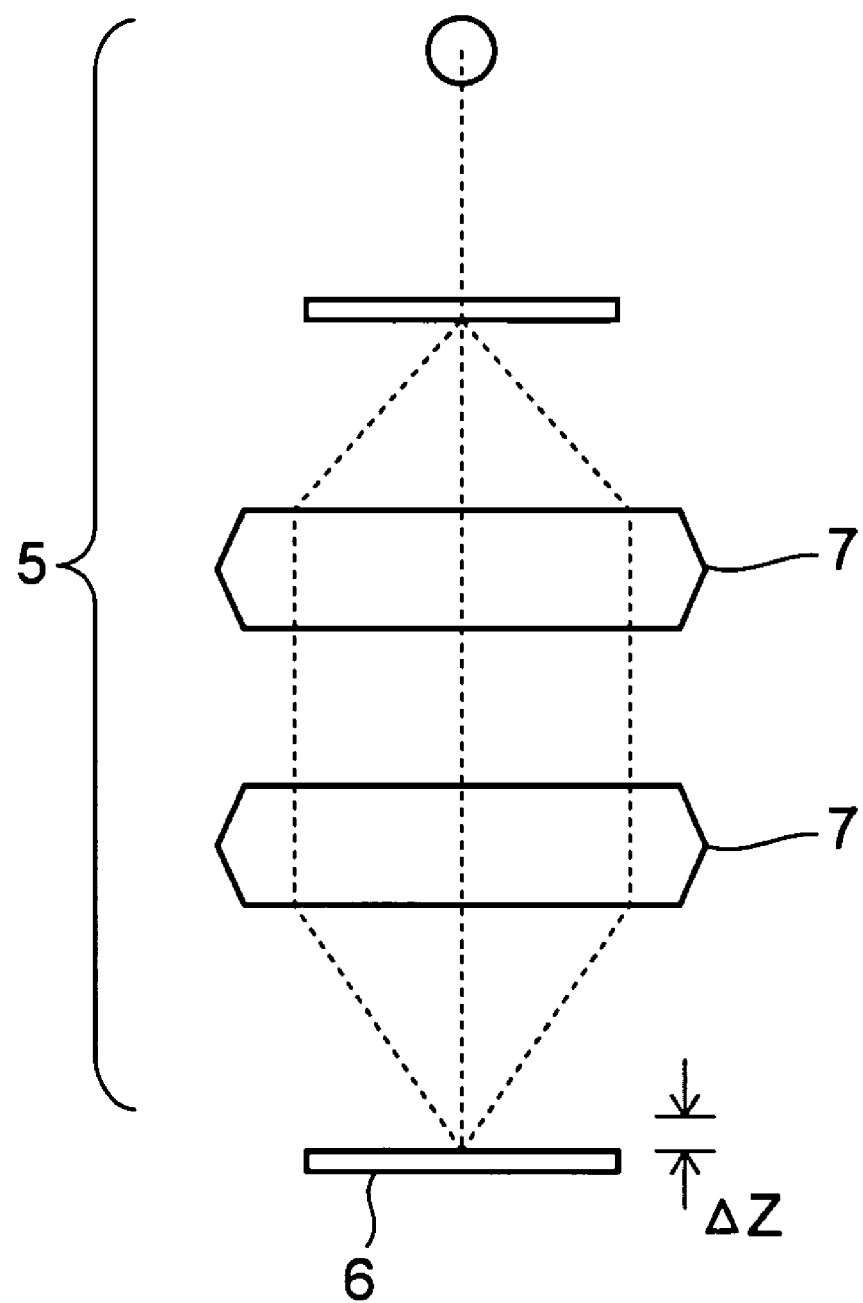
FIG. 5 is a view explaining that the defocus is generated due to an error in the exposure equipment.
Figure 6:
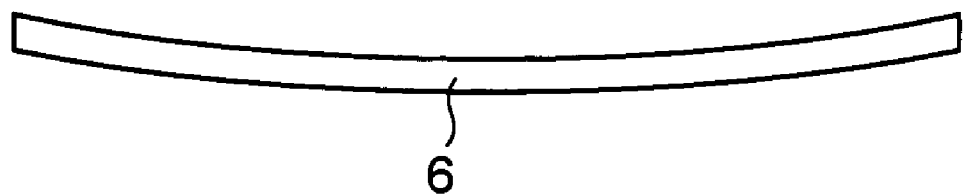
FIG. 6 is a view explaining that the defocus is generated due to a warp of the semiconductor substrate.
Figure 7:
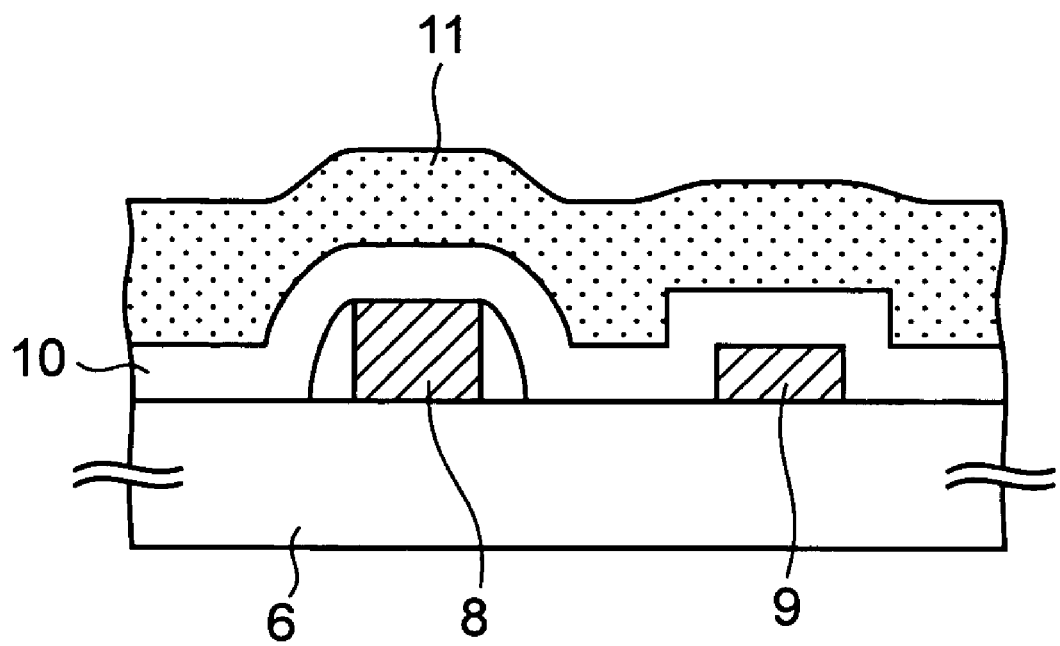
FIG. 7 is a view explaining that the defocus is generated due to an unevenness of a surface of the photoresist.

Such defocus may be caused due to various factors in manufacturing steps of the semiconductor device. FIG. 5 to FIG. 7 are views explaining the factors by which the defocus is caused.

In an example in FIG. 5, a focal point is deviated from a silicon substrate 6 due to an error in an exposure equipment 5, e.g., a change in the focal length of a projection lens 7 caused by a variation of an atmospheric pressure, and thus a defocus $\Delta Z$ is generated.

Also, as shown in FIG. 6, in some cases the silicon substrate 6 is warped since various films having different stresses are stacked on the silicon substrate 6 in the semiconductor device manufacturing steps. In this case, even when the best focus state is attained around the center of the silicon substrate 6, the defocus state is generated near the periphery.

Further, as shown in FIG. 7, sometimes unevenness is generated on a surface of an underlying insulating film 10 by gate electrodes 8, wirings 9, and the like formed under this insulating film 10 on the silicon substrate 6. In this case, because unevenness is also formed on a surface of the photoresist 11 as an object of the exposure, the local the defocus is generated due to such unevenness.

If the exposure mask has the shallow depth of focus, the resist pattern is finished to have the size different from the designed value when the focal shift is generated for the reasons in FIG. 5 to FIG. 7, which makes the final semiconductor device defective and in turn acts as a factor to lower a yield of the semiconductor device. In addition, if a design rule is reduced much more in the future, the semiconductor device is ready to become defective due to a minute focal shift.

Therefore, in order not to generate the defective semiconductor device and to attain the stable mass production of the semiconductor device even when the focal shift is generated due to the factors explained in FIG. 5 to FIG. 7 or a miniaturization of the design rule, the depth of focus in the exposing step must be set as deep as possible.

Figure 8:
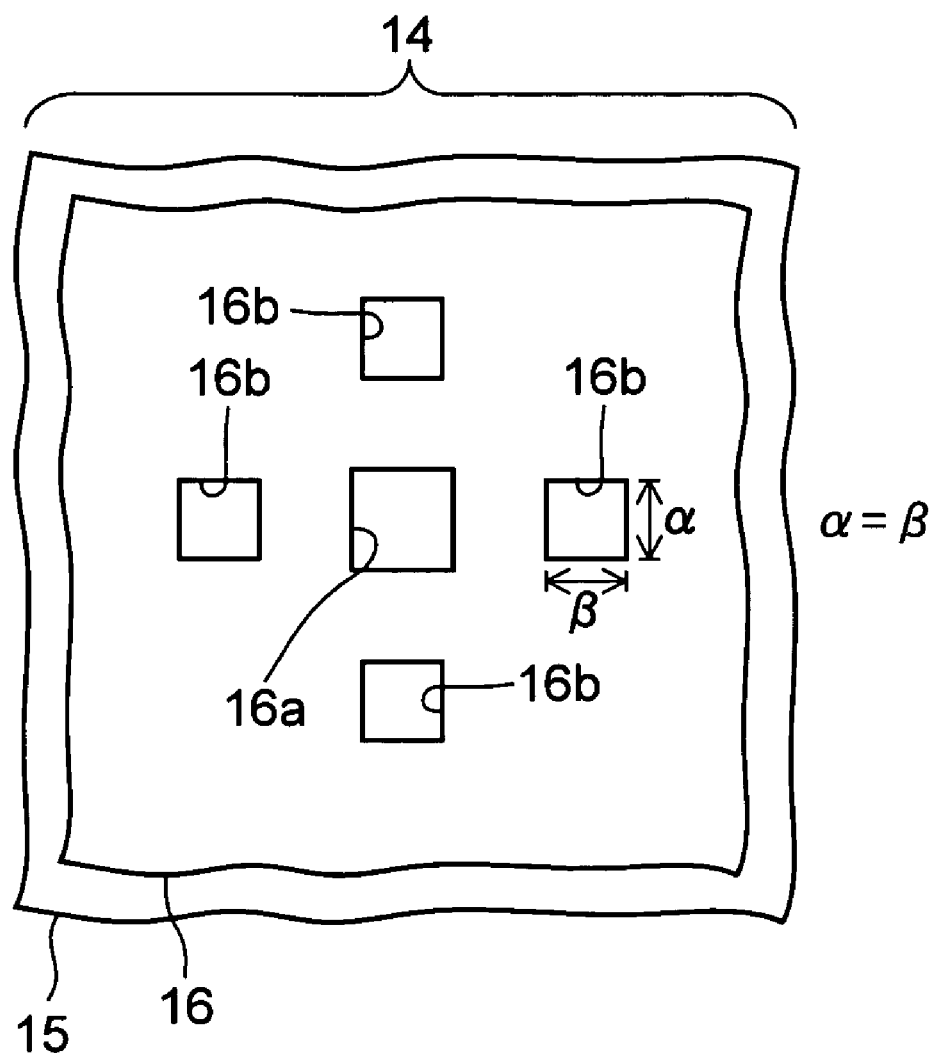
FIG. 8 is an enlarged plan view of an exposure mask proposed by Patent Literature 1 to increase a depth of focus.

FIG. 8 is an enlarged plan view of the exposure mask proposed by Patent Literature 1 to deepen the depth of focus. An exposure mask 14 is constructed by forming a light shielding film 16 on a quartz substrate 15 and then forming a coarse main feature 16a and assist features 16b in the light shielding film 16. A projected image of the main feature 16a out of these features 16a, 16b corresponds to the device pattern. In contrast, the assist features 16b are formed around the main feature 16a, and are formed in size to such an extent that they are not resolved on the silicon substrate (not shown). The assist feature 16b has a rectangular planar shape a longitudinal length $\alpha$ and a lateral length $\beta$ of which are set equal to each other.

Figure 9:
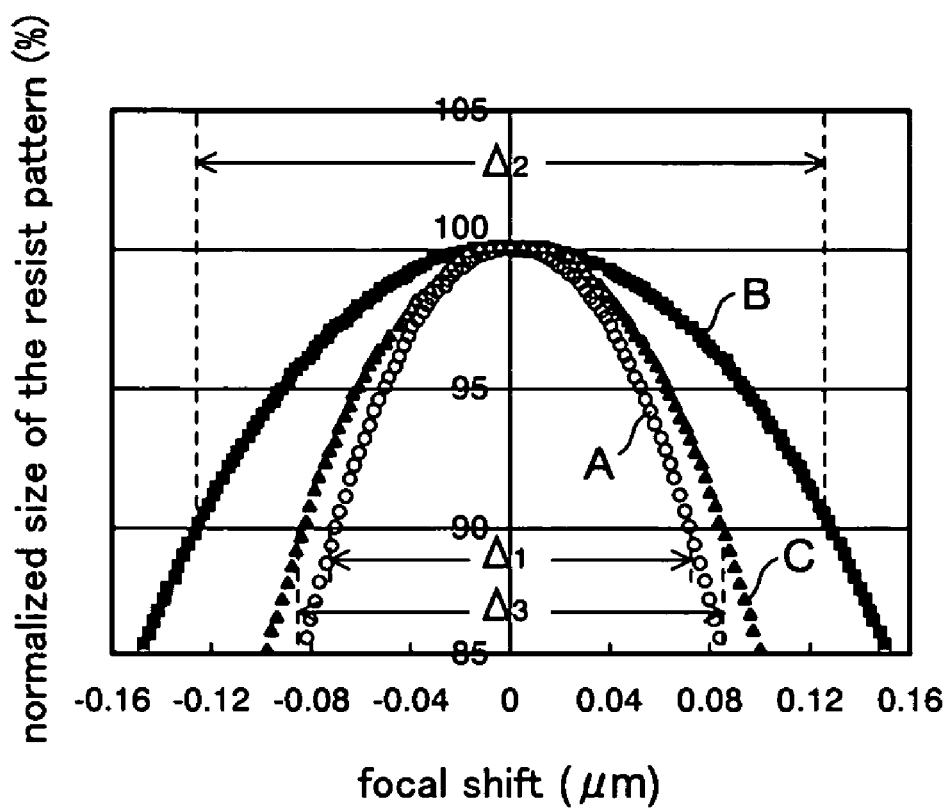
FIG. 9 is a view showing a CD-FOCUS curve of the exposure mask in Patent Literature 1.

FIG. 9 is a view showing a CD-FOCUS curve C of such main feature 16a. For the sake of comparison, the CD-FOCUS curves A, B already shown in FIG. 1 are also depicted in FIG. 9.

As shown in FIG. 9, a gradient of the CD-FOCUS curve C is made slightly gentle rather than the curve A by providing the assist features 16b. Thus, a depth of focus $\Delta_3$ of the main feature 16a can be increased by about 15% in contrast to the depth of focus $\Delta_1$ derived when the assist features 16b are not provided. However, it is impossible to say that the depth of focus $\Delta_3$ is sufficiently deepened in contrast to that of the dense pattern indicated by the curve B. Thus, it is difficult to say that the technology recited in Patent Literature 1 is proposed to keep the stable mass production in mind.

In view of the above circumstances, the inventors of this application have thought of embodiments of the present invention explained hereunder.

(2) First Embodiment

Figure 10:
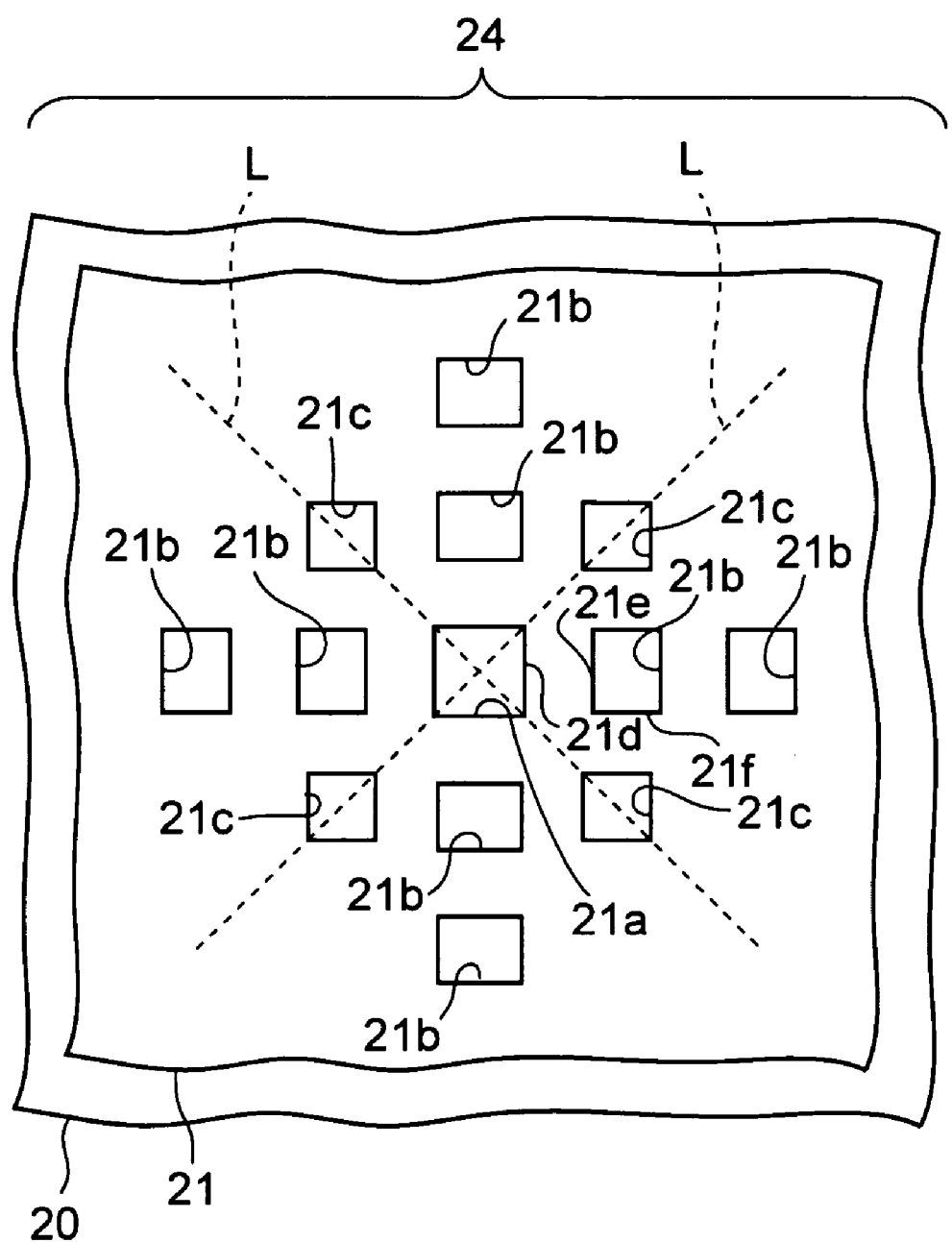
FIG. 10 is an enlarged plan view of an exposure mask according to a first embodiment of the present invention.

FIG. 10 is an enlarged plan view of an exposure mask according to a first embodiment of the present invention.

An exposure mask 24 is used in the exposure equipment whose reduction ratio is ¼ times, for example. This exposure mask 24 is constructed by forming a film 21 on a quartz substrate (transparent substrate) 20 and then forming a main feature (main opening) 21a and first and second assist features (assist openings) 21b, 21c in the film 21 at an interval mutually. The film 21 is not particularly limited. But a light shielding layer such as a chromium layer, or the like is formed as the film 21 when the exposure mask 24 is constructed as a binary mask, while a semitransparent layer such as a molybdenum silicide layer, or the like is formed as the film 21 when the exposure mask 24 is constructed as a halftone mask. In the present embodiment, such film 21 is formed to have a thickness of about 70 nm.

The main feature 21a out of the above features has a planar shape corresponding to the device pattern such as the hole, the gate electrode, or the like, and has a size enough to be resolved by the exposure equipment such as the stepper, the scanner, or the like, e.g., a size of about 0.13 μm×0.13 μm, and an image thereof is projected onto the photoresist (not shown). In contrast, the first and second assist features 21b, 21c are formed in size not to be resolved by the exposure equipment, and plays a role to deepen the depth of focus of the main feature 21a.

Figure 12:
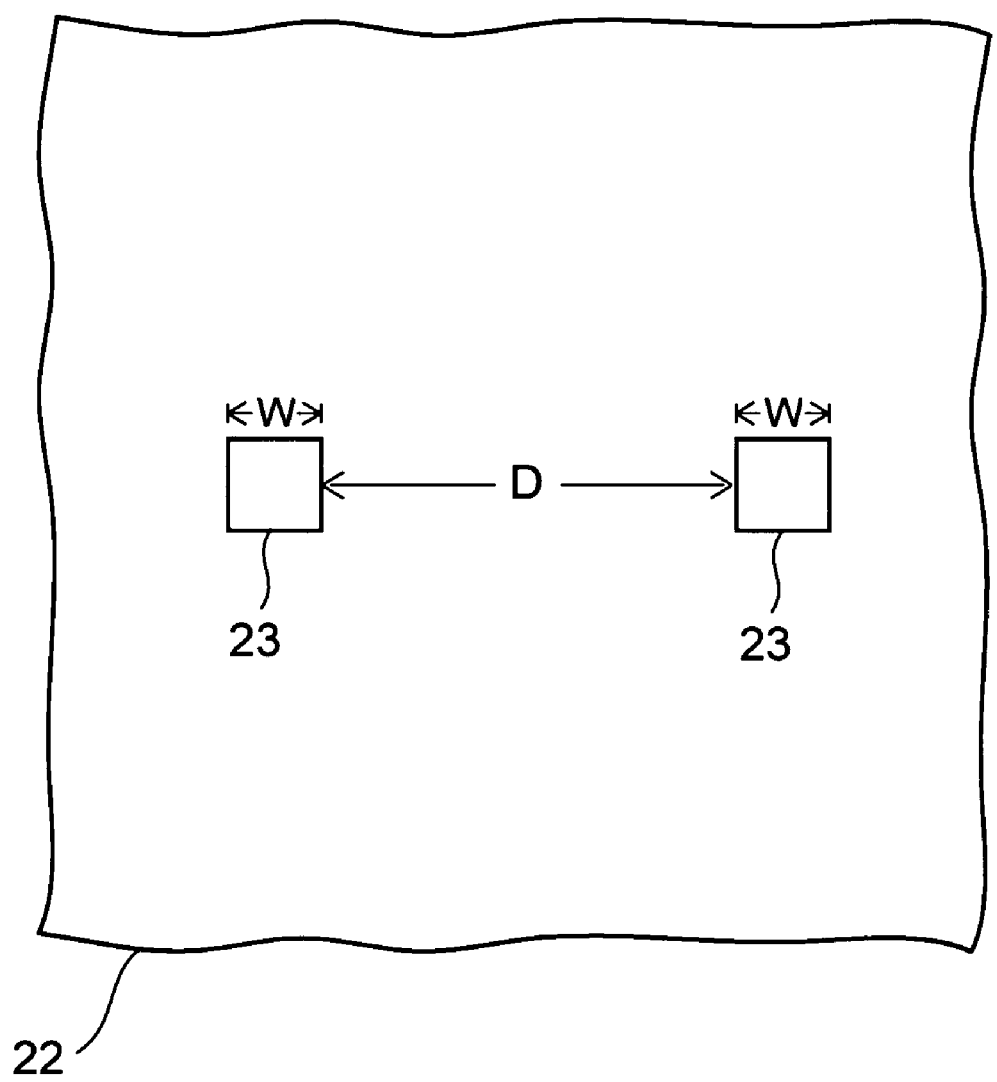
FIG. 12 is a plan view used to define coarse/dense of features.

In the example in FIG. 10, the main feature 21a is formed in the coarse state. In this specification, the density of the features is defined as shown in FIG. 12. That is, in the situation that a plurality of main features 21a are present, it defined that the main features 21a are in the coarse state if an interval D between projected images 23 of the main features 21a on a silicon substrate 22 is three times or more a width W of the projected image 23, while it is defined that the main features 21a are in the dense state if the above condition is not satisfied.

Also, as shown in FIG. 10, a planar shape of the first assist feature 21b is a rectangle having a long side 21e and a short side 21f, and the long side 21e is arranged in a position that opposes to one side 21d of the main feature 21a. Here, respective lengths of the long side 21e and the short side 21f are not particularly limited. In the present embodiment, a length of the long side 21e is set to about 0.12 μm and a length of the short side 21f is set to about 0.10 μm. In addition, in the example in FIG. 10, such first assist feature 21b is provided in twos at a distance just beside four sides of the main feature 21a in the direction to leave the main feature 21a respectively.

In contrast, the second assist features 21c are positioned on virtual prolonged lines L of the diagonal of the main feature 21a, and its planar shape is a square that has a size of about 0.11 μm×0.11 μm, for example.

In this manner, in the present invention, the first assist feature 21b arranged beside the main feature 21a is shaped into a rectangle that is long in the direction of the side 21d of the main feature 21a, and also the second assist features 21c are arranged in oblique positions when viewed from the main feature 21a, i.e., on the virtual prolonged lines L of the diagonals.

Figure 11:
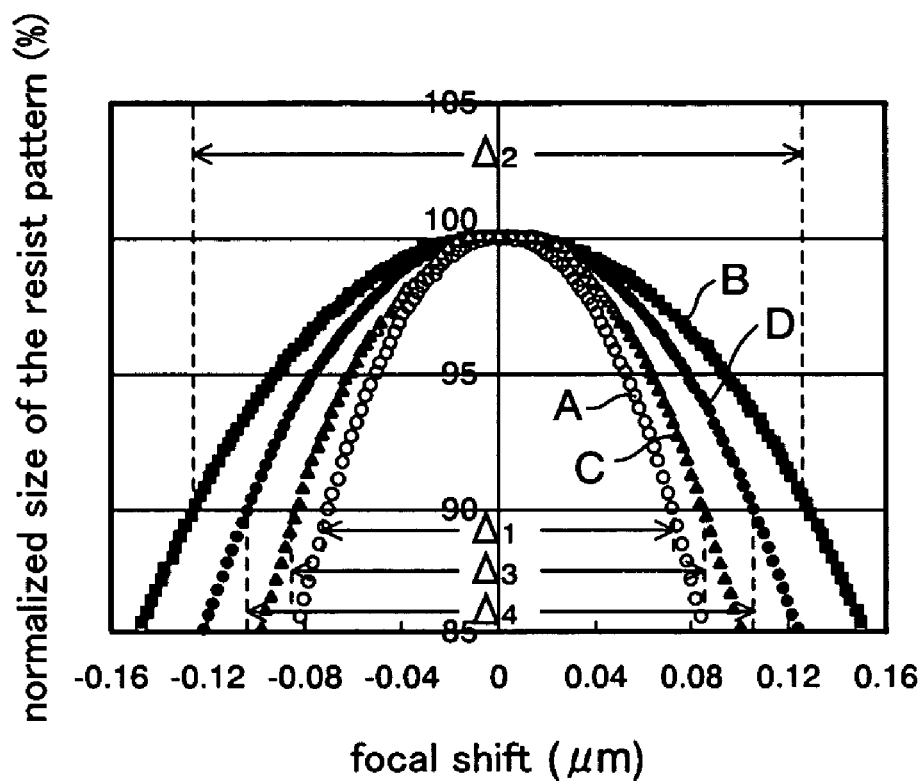
FIG. 11 is a view showing a CD-FOCUS curve of the exposure mask according to the first embodiment of the present invention.

FIG. 11 is a showing a CD-FOCUS curve D of the exposure mask 24 according to the present embodiment. In FIG. 11, for the sake of comparison, the CD-FOCUS curves A, B in FIG. 1 and explained in the preliminary explanation and the CD-FOCUS curve C in FIG. 9 are also depicted.

As shown in FIG. 11, a gradient of the CD-FOCUS curve D indicated by ● in the present embodiment becomes gentle in contrast to the CD-FOCUS curve C of the exposure mask 14 (see FIG. 8) in which no second assist feature 21c is provided. As a result, a depth of focus $\Delta_4$ that is deeper by about 42% than the CD-FOCUS curve A obtained when the assist feature is not provided at all and is deeper by about 27% than the above CD-FOCUS curve C can be obtained.

The reason why such deep depth of focus can be obtained is that not the number of the assist features 21b, 21c provided around the main feature 21a is simply increased rather than the case in FIG. 8 but the planar shape of the first assist feature 21b is shaped into the rectangle that has the long side opposing to the main feature 21a.

Figure 13:
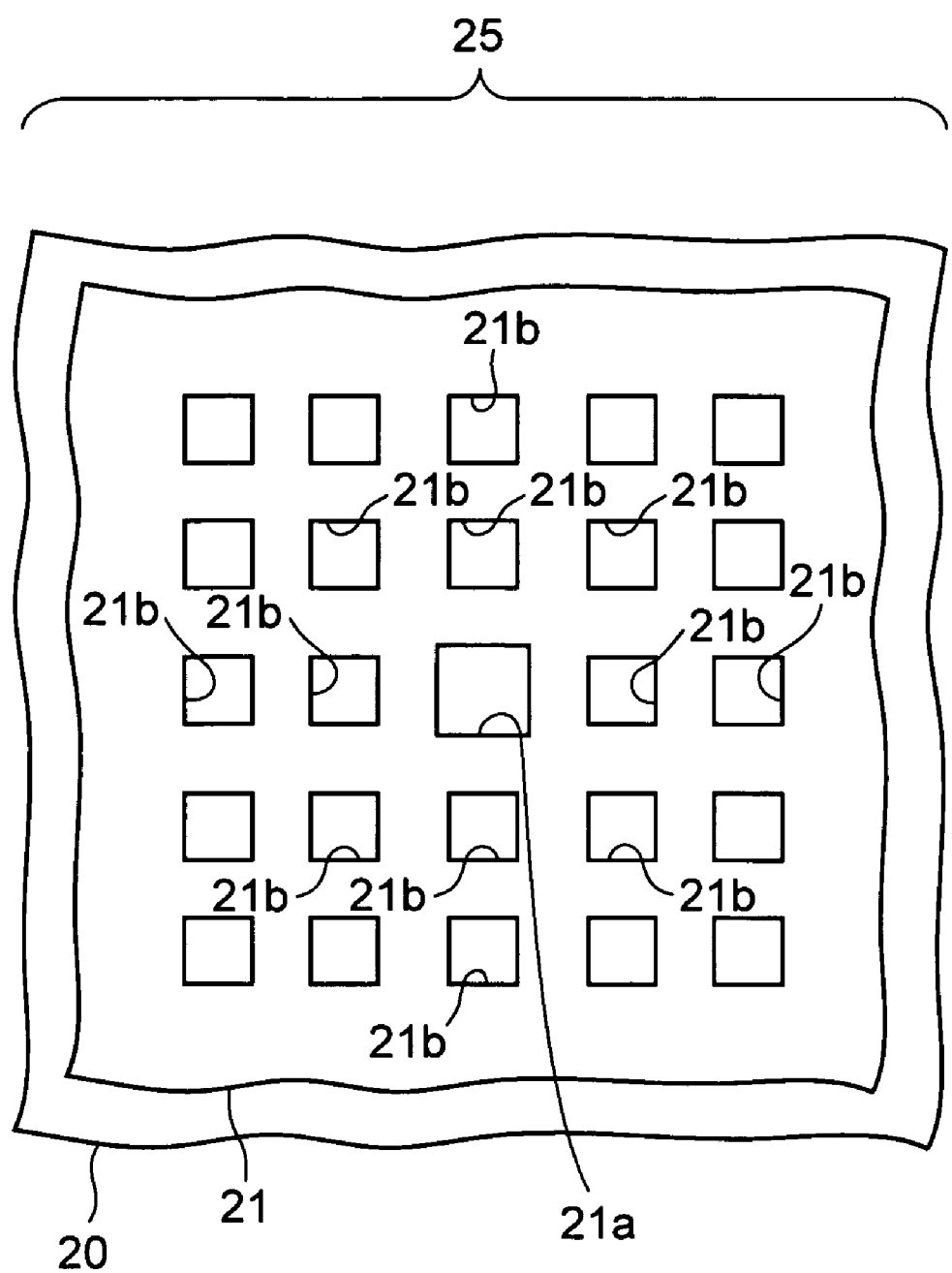
FIG. 13 is an enlarged plan view of an exposure mask according to a comparative example that is formed to examine how the depth of focus is affect by the number and shape of first assist features.

FIG. 13 is an enlarged plan view of an exposure mask according to a comparative example that is formed to examine how the depth of focus is affect by the number and shape of the first assist features 21b.

As shown in FIG. 13, in an exposure mask 25, a planar shape of the first assist feature 21b is formed as a square, and also the first assist features 21b that are larger in number than those of the exposure mask 24 (see FIG. 10) according to the present embodiment are arranged around the main feature 21a in grid-like fashion.

Figure 14:
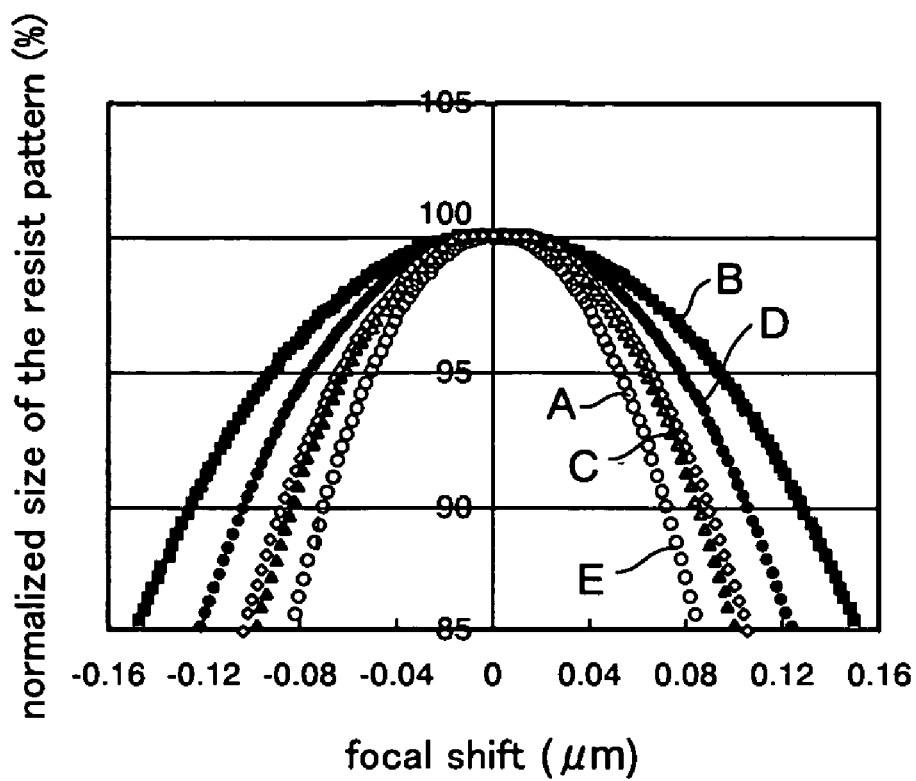
FIG. 14 is a view showing a CD-FOCUS curve of the exposure mask according to the comparative example in FIG. 13.

FIG. 14 is a view showing a CD-FOCUS curve E of the exposure mask 25 according to this comparative example. In FIG. 14, for the sake of comparison, the CD-FOCUS curves A to D already described are also depicted.

As apparent from FIG. 14, in the exposure mask 25 according to this comparative example, a gradient of the CD-FOCUS curve E becomes sharp rather than the curve D in the present embodiment, and also the depth of focus becomes shallow. As the result of this, it is appreciated that the depth of focus cannot be effectively deepened only by increasing the number of first assist features 21b having the square shape around the main feature 21a, but it is effective in increasing the depth of focus that a rectangle having a long side opposing to the main feature 21a should be formed as the first assist feature 21b, like the present embodiment.

Figure 15A:
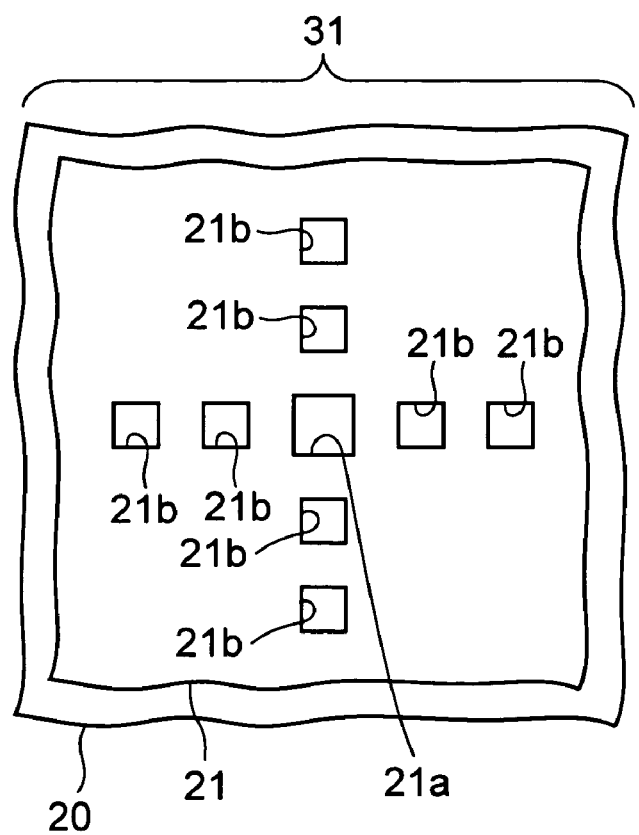
FIGS. 15A and 15B are enlarged plan views showing exposure masks that are formed to examine an influence of the shape of the first assist feature on the depth of focus respectively.
Figure 15B:
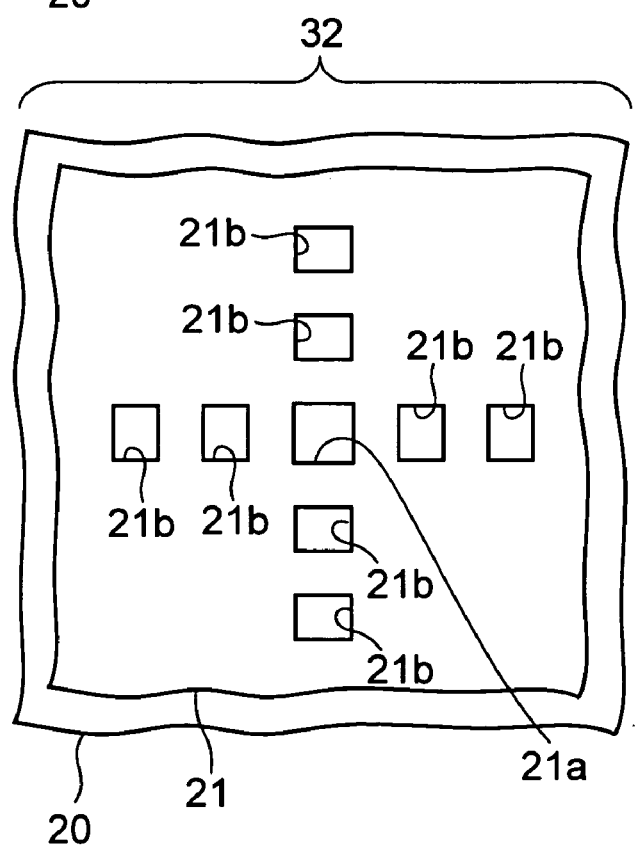

FIGS. 15A and 15B are enlarged plan views showing exposure masks 31, 32 that are formed to examine an influence of the shape of the first assist feature 21b on the depth of focus respectively.

In the exposure mask 31 shown in FIG. 15A, the planar shape of the first assist feature 21b is set to the square having a size that is not resolved. In contrast, in the exposure mask 32 shown in FIG. 15B, like the present embodiment, the rectangle obtained by expanding the side opposing to the main feature 21a to such extent that such side is not resolved is used as the first assist feature 21b.

Figure 16:
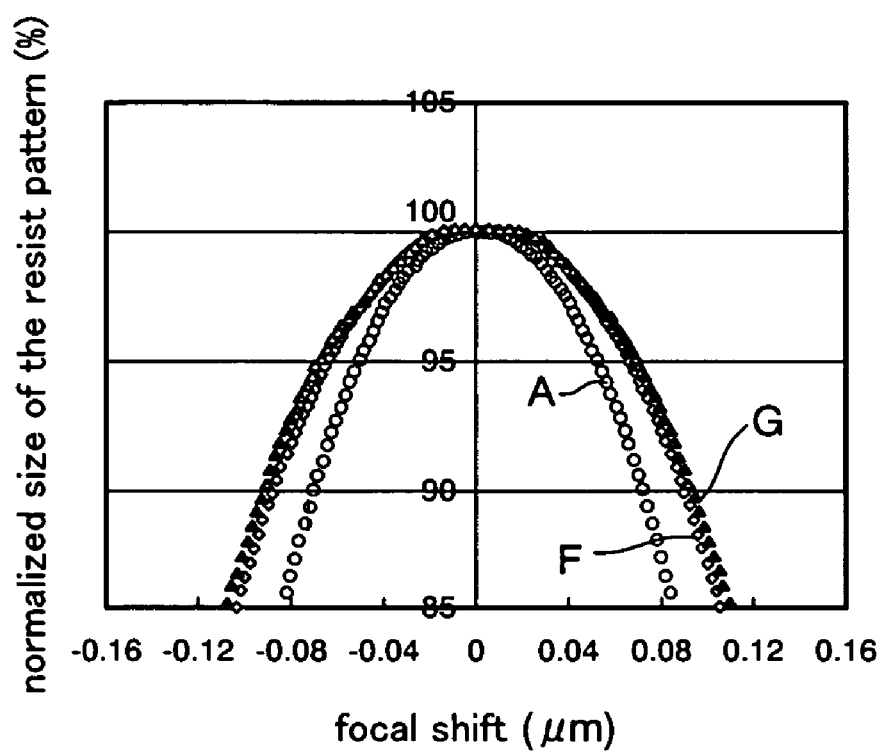
FIG. 16 is a view showing CD-FOCUS curves of FIG. 15A and FIG. 15B respectively.

FIG. 16 is a view showing a CD-FOCUS curve F of the exposure mask 31 and a CD-FOCUS curve G of the exposure mask 32. In FIG. 16, for the sake of comparison, the CD-FOCUS curve A in FIG. 1 is also depicted.

As apparent from this, a gradient of the CD-FOCUS curve G obtained when the planar shape of the first assist feature 21b is shaped into the rectangle becomes gentle rather than the CD-FOCUS curve F obtained when the above planar shape is shaped into the square. From the above, it becomes apparent that it is useful in deepening the depth of focus that the rectangle whose side opposing to the main feature 21a is the long side should be employed as the planar shape of the first assist feature 21b.

Next, advantages attained by such deep depth of focus will be explained hereunder.

Figure 17:
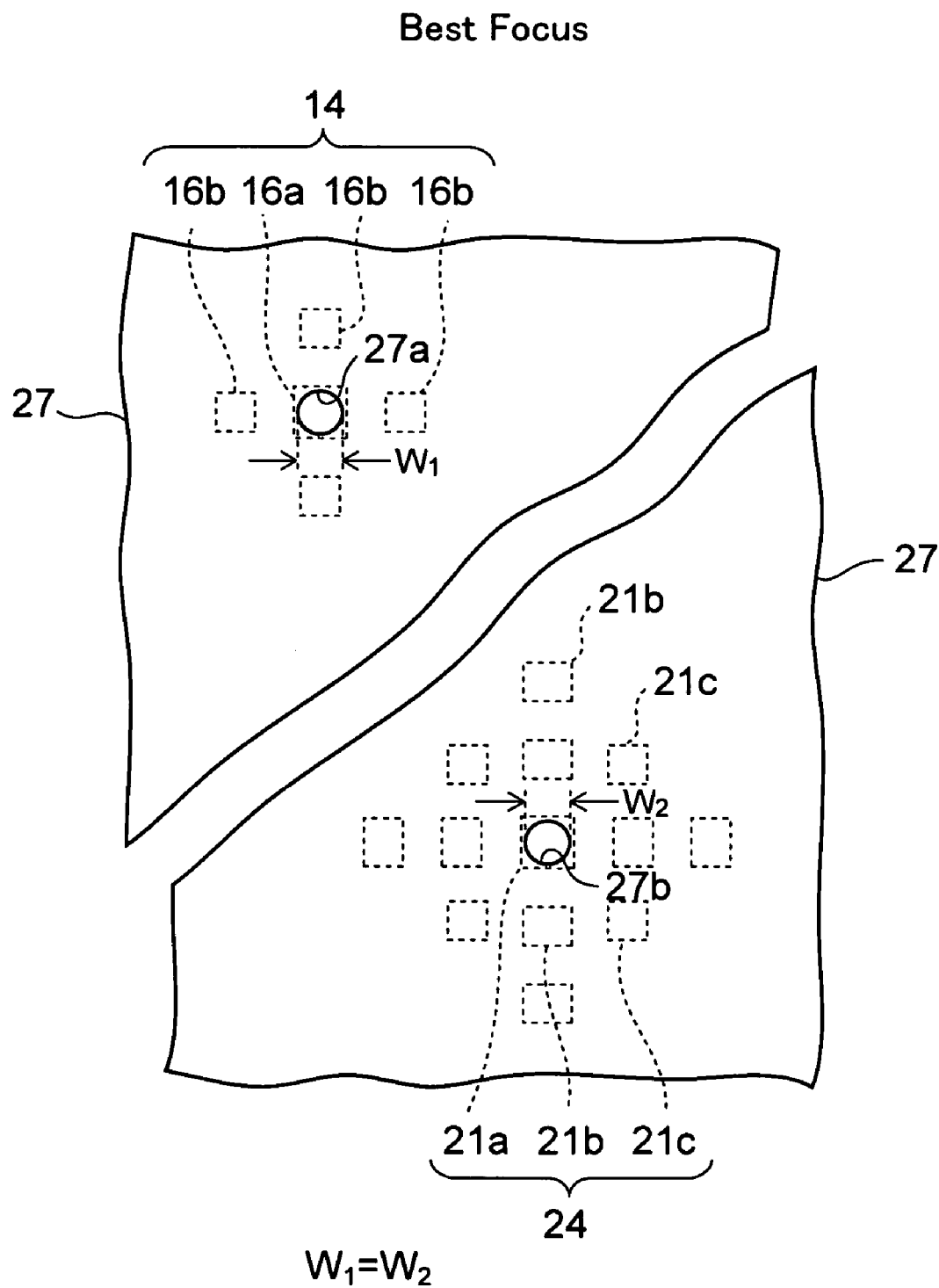
FIG. 17 is a plan view showing schematically holes of resist patterns exposed in a best focus state, by using the exposure mask according to the present embodiment and the exposure mask explained in the preliminary explanation respectively.

FIG. 17 is a plan view showing schematically holes 27a, 27b of resist patterns 27 exposed in the best focus state, by using the exposure mask 24 (see FIG. 10) according to the present embodiment and the exposure mask 14 (see FIG. 8) explained in the preliminary explanation respectively. It is assumed in the following that sizes of the main features 16a, 21a constituting the exposure masks 14, 24 are set equally mutually.

As shown in FIG. 17, diameters $W_1$, $W_2$ of respective holes 27a, 27b are set almost equal to each other in the best focus state.

Figure 18:
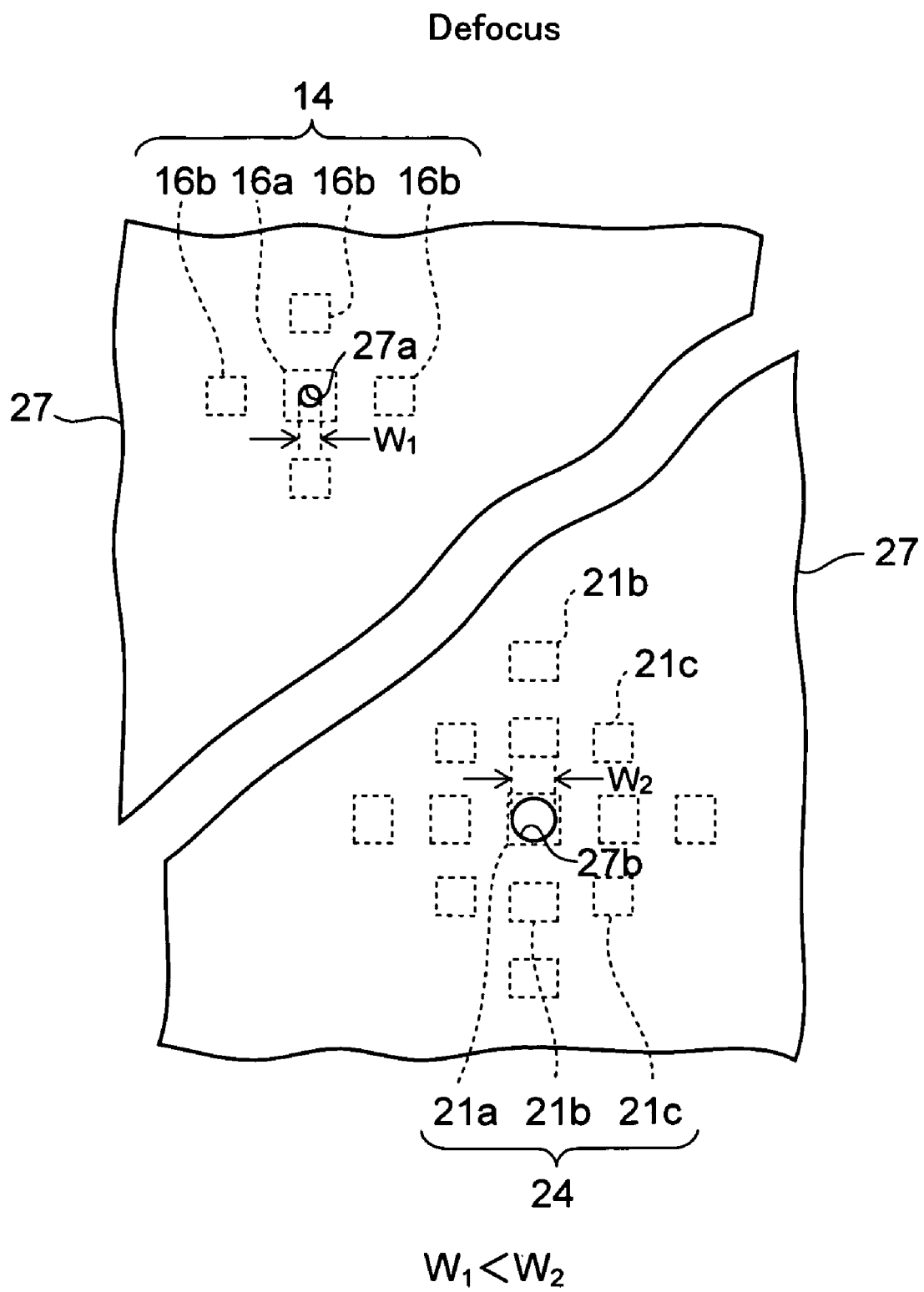
FIG. 18 is a plan view showing schematically holes of resist patterns exposed in a defocus state, by using the exposure mask according to the present embodiment and the exposure mask explained in the preliminary explanation respectively.

In contrast, FIG. 18 is a plan view showing schematically respective holes 27a, 27b formed in the defocus state.

As shown in FIG. 18, in the exposure mask 14 explained in the preliminary explanation, a change of intensity of the exposure light due to the defocus is large, and thus the diameter $W_1$ of the hole 27a is reduced smaller than that in the best focus state (FIG. 17).

In contrast, the exposure mask 24 according to the present embodiment, a change of intensity of the exposure light can be reduced even in the defocus state, so that the hole 27b having a size that is almost equal to that in the best focus state can be formed.

Accordingly, in the present embodiment, even when the resist pattern is brought into the defocus state due to the factors explained in FIG. 5 to FIG. 7, it can be prevented that a size of the resist pattern such as a diameter of the hole, or the like is deviated largely from the designed value. Therefore, it can be prevented that the final semiconductor device becomes defective and in turn a yield of the semiconductor device can be improved.

(3) Second Embodiment

In the above first embodiment, as shown in FIG. 10, the first and second assist features (assist openings) 21b, 21c are formed around the coarse main feature (main opening) 21a. In contrast, in the present embodiment, the first and second assist features 21b, 21c are formed on the outer periphery of the main features 21a that are formed densely.

(i) First Example

Figure 19:
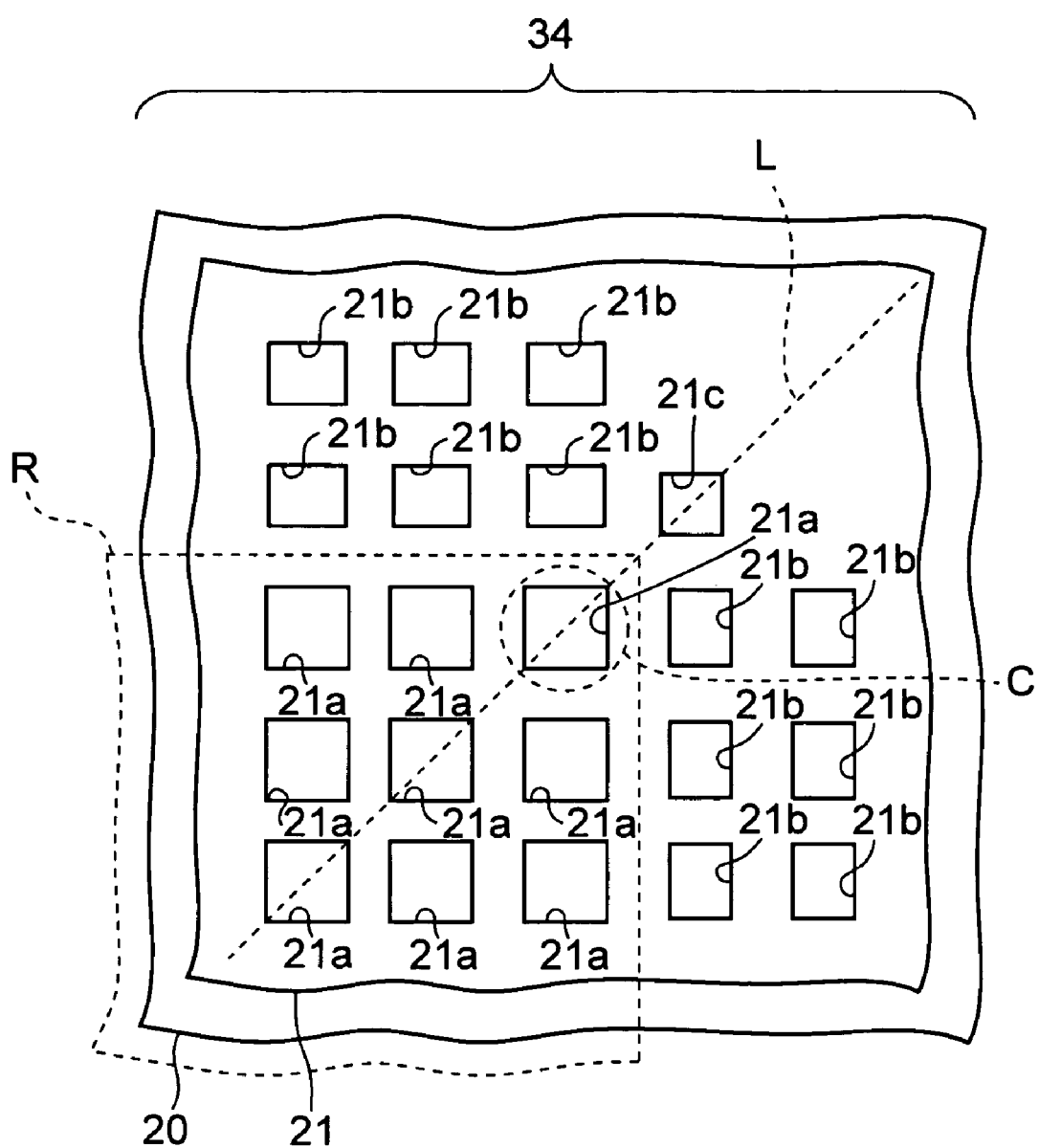
FIG. 19 is an enlarged plan view of an exposure mask according to a first example of a second embodiment of the present invention.

FIG. 19 is an enlarged plan view of an exposure mask according to a first example of the present embodiment.

In an exposure mask 34, the main feature 21a is formed repeatedly densely in row and column directions in a partial region R of the quartz substrate 20. Here, the wording "the features are dense" signifies that the interval D between the projected images 23 of the main features 21a is below three times of the width W of the projected image, as defined in FIG. 12.

Then, as shown in FIG. 19, a plurality of first assist features 21b are formed to oppose to the main features 21a on the outermost periphery respectively, and also the second assist feature 21c is formed on the virtual prolonged line L of the diagonal of the main feature 21a located at a corner portion C of the partial region R. The planar shapes of these first and second assist features 21b, 21c are similar to those in the first embodiment. The first assist feature 21b has the square and the second assist feature 21c has the rectangle whose side opposing to the main feature 21a is the long side.

According to such exposure mask 34, because no main feature 21a is formed on the outside of the region R, the main features 21a located on the outermost periphery exhibit similar behavior to that of the coarse feature, and also the depth of focus has a tendency to become shallow. Therefore, in the present embodiment, the first and second assist features 21b, 21c are arranged around the region R to increase the depth of focus that is inclined to be insufficient near the boundary of the region R. As a result, it can be prevented that the projected images of the main features 21a on the outermost periphery are reduced in size owing to the lack of the depth of focus, and also a size of the resist pattern that is close to the designed value can be maintained.

(ii) Second Example

Figure 20:
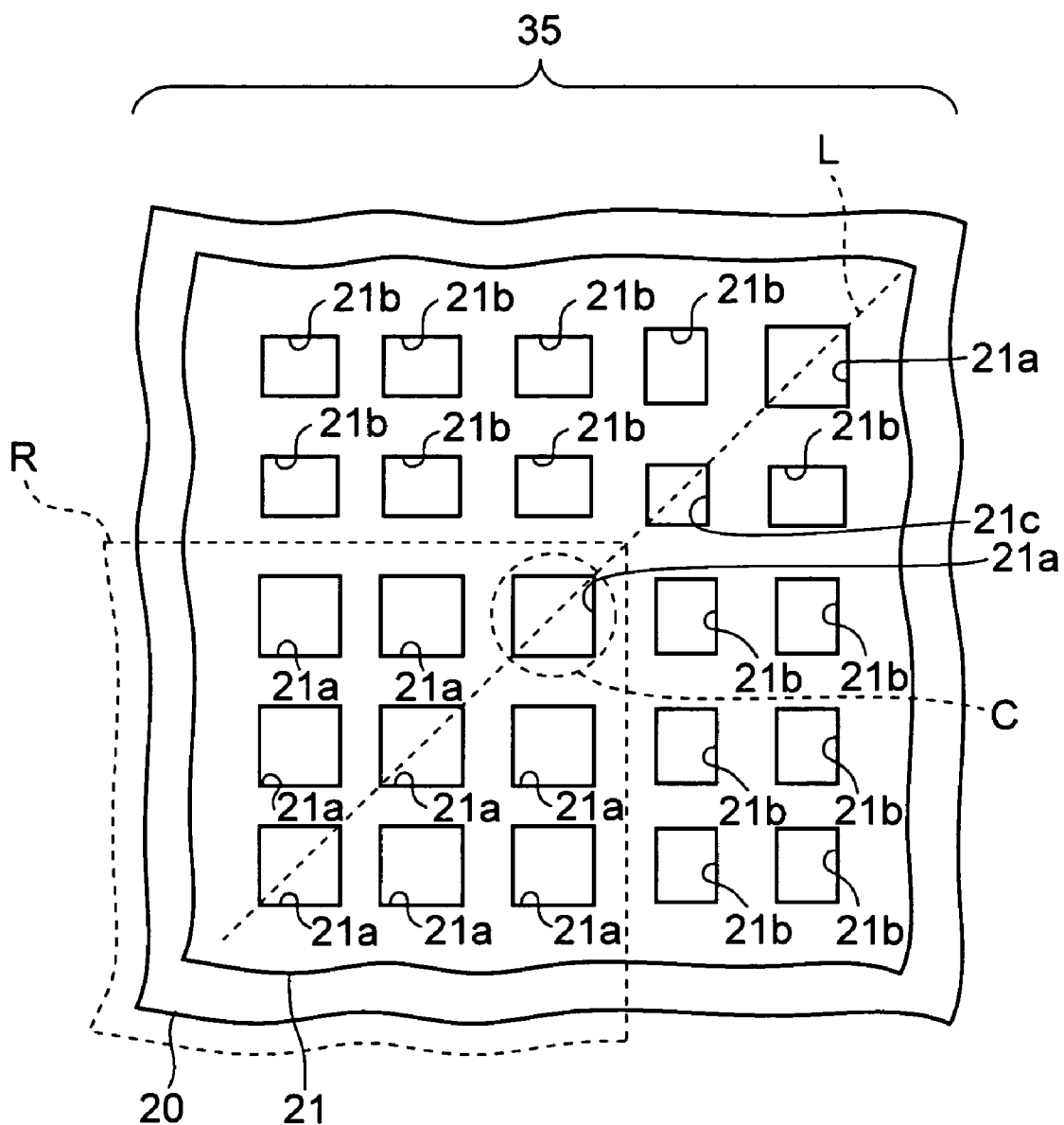
FIG. 20 is an enlarged plan view of an exposure mask according to a second example of the second embodiment of the present invention.

FIG. 20 is an enlarged plan view of an exposure mask according to a second example of the present embodiment.

As shown in FIG. 20, in an exposure mask 35, the coarse main feature 21a is formed on the virtual prolonged line L on the outside of the partial region R explained in FIG. 19. Then, the second assist feature 21c is formed on the virtual prolonged line L between the coarse main feature 21a and the main feature 21a located at the corner portion C of the region R.

According to this, the depth of focus that is inclined to be insufficient in the coarse main feature 21a located on the outside of the region R and the main feature 21a, which exhibits similar behavior to that of the coarse feature formed on the outermost periphery of the region R, respectively can be increased by the first and second assist features 21b, 21c. Therefore, even though a minute focal shift is caused in the exposure step, it can be prevented that the projected images of these main features 21a are reduced smaller than the designed value. As a result, a size of the resist pattern can be finished to have the value that is close to the designed value.

(4) Third Embodiment

In this embodiment, a method of manufacturing the exposure mask 24 (see FIG. 10) explained in the first embodiment will be explained hereunder.

Figure 21:
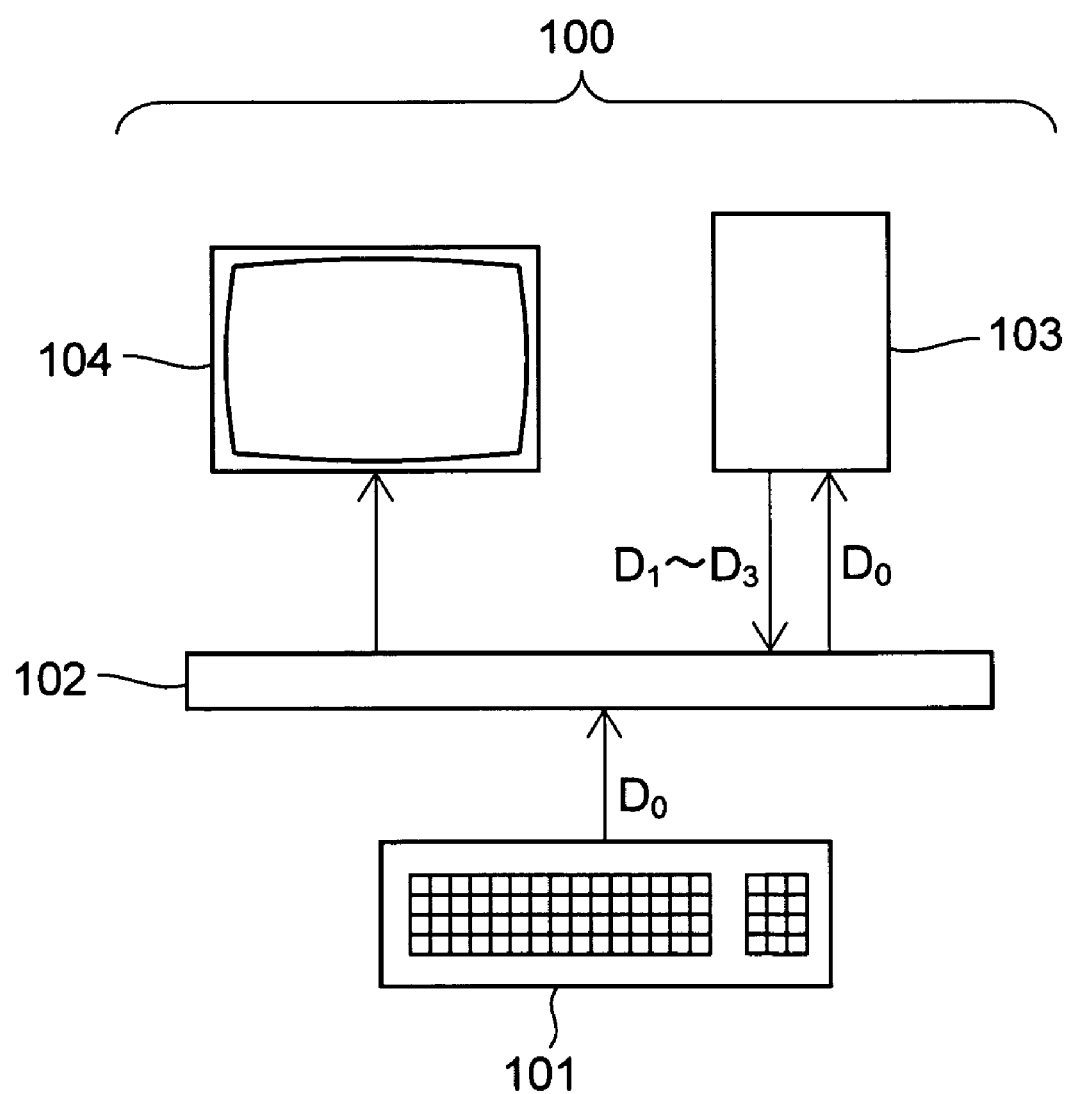
FIG. 21 is a configurative view of a design system used in an exposure mask manufacturing method according to a third embodiment of the present invention.

FIG. 21 is a configurative view of a design system used to design an exposure mask according to the present embodiment. A design system 100 includes an input portion 101 such as the keyboard, or the like used when the operator inputs design data $D_0$ of the device pattern, etc., and a display portion 104 such as a monitor for displaying respective features 21a to 21c on the exposure mask to simulate them. A bus 102 is connected to the input portion 101 and the display portion 104, and the data are transferred between respective portions via the bus 102. In addition, a control portion 103 such as CPU, or the like is connected to the bus 102. The control portion 103 has a function of forming design data $D_1$ of the main feature 21a by applying various processes such as the OPC process, and the like to the design data $D_0$ of the device pattern, and also has a function of forming design data $D_2$, $D_3$ of the first and second assist features 21b, 21c already described.

Figure 22:
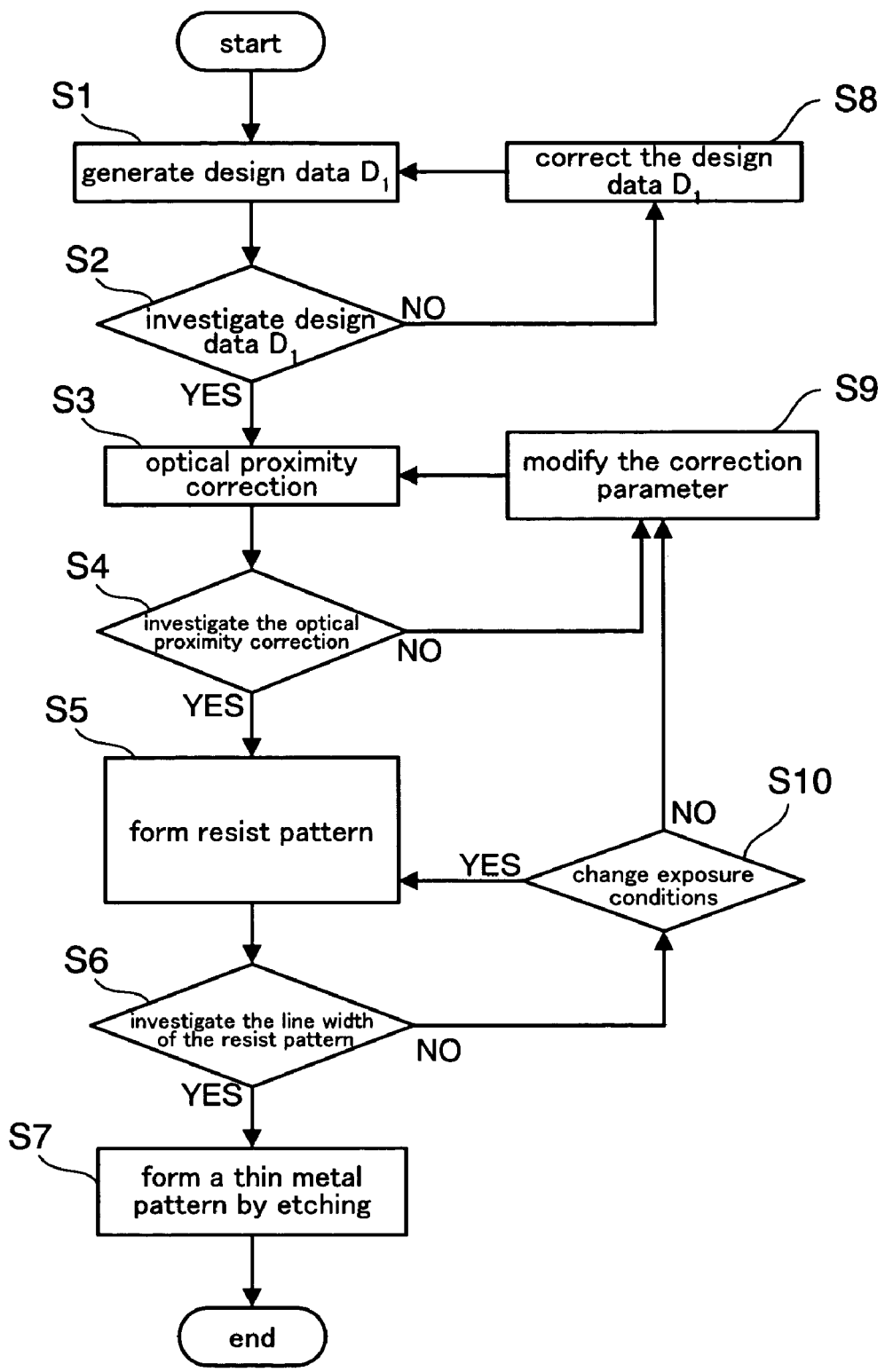
FIG. 22 is a flowchart showing an exposure mask manufacturing method according to the third embodiment of the present invention.
Figure 23:
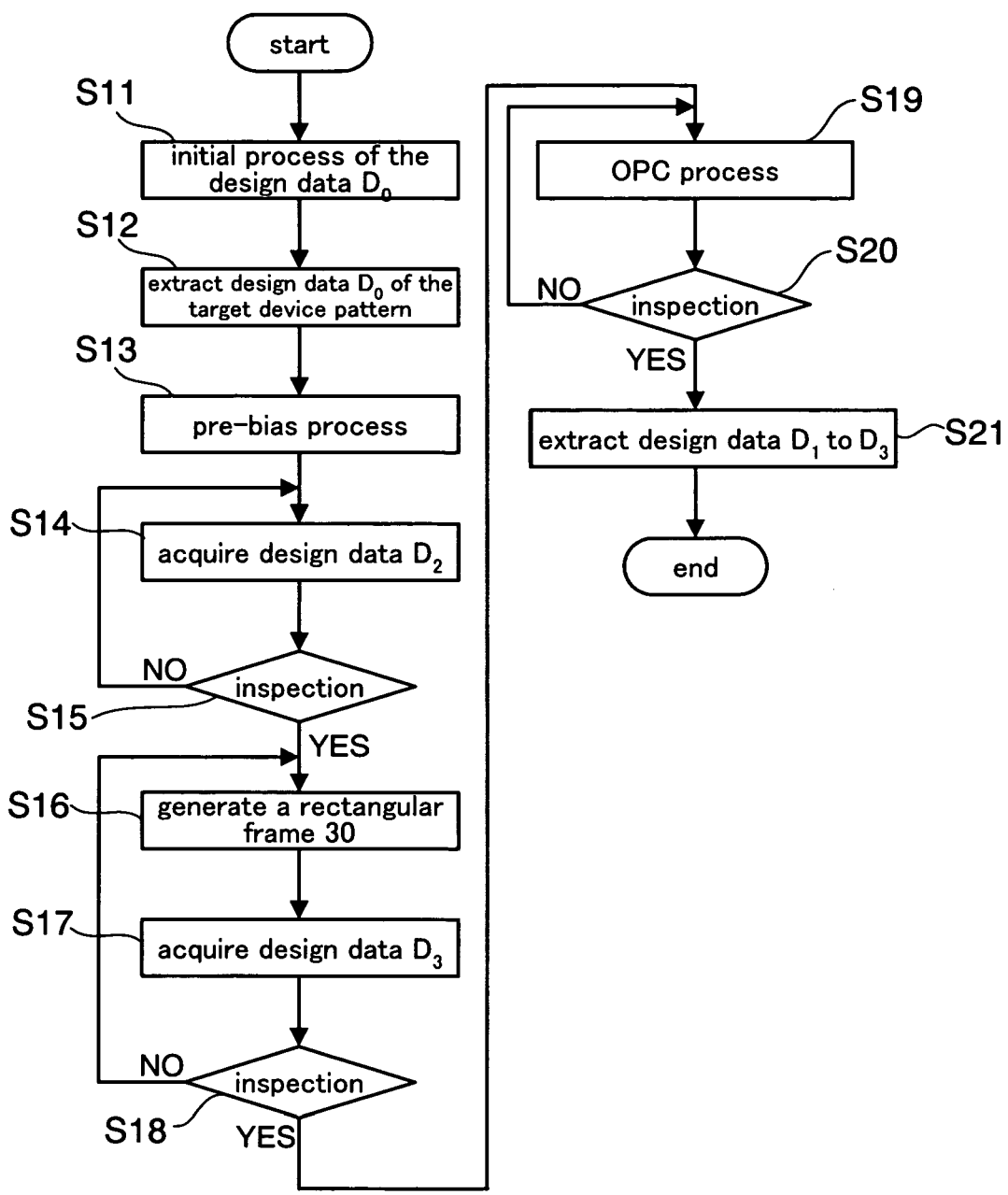
FIG. 23 is a detailed flowchart of step S3 in the flowchart in FIG. 22.

FIG. 22 is a flowchart showing an exposure mask manufacturing method executed by using the above design system 100, and FIG. 23 is a flowchart showing details of step S3 in the flowchart in FIG. 22. Also, following explanations will be made while appropriately referring to FIGS. 24A to 24D that are sectional views showing the exposure mask in the middle of manufacture.

As shown in FIG. 22, in step S1, the design data $D_0$ of the device pattern to be formed on a silicon wafer is input from the input portion 101 to the control portion 103. The design data $D_0$ is the data that includes positions and sizes of the device patterns such as the contact holes, etc., for example.

Then, the control portion 103 applies a geometrical similar extension to the planar shape of the device pattern by a predetermined magnification, e.g., a reciprocal of a reduction ratio in the exposure equipment, and then acquires position data and profile data of the resultant pattern as the design data $D_1$ of the main feature 21a (see FIG. 10).

Then, the process goes to step S2. In the step S2, it is decided whether or not the design data $D_1$ is formed in accordance with a design rule. Here, the "design rule" is meant to be restrictions in forming the main feature 21a of the exposure mask (see FIG. 10), such as a minimum width of the main feature 21a, a minimum interval between the main features 21a, etc., for example.

Then, if it is decided that the design data $D_1$ does not satisfy the design rule (NO), the process goes to step S8, and the design data $D_1$ is corrected therein.

On the other hand, if it is decided that the design data $D_1$ satisfies the design rule (YES), the process goes to step S3.

In the situation where a size of the main feature 21a (see FIG. 10) formed on the exposure mask 24 comes close to a wavelength of the exposure light, the projected image of the main feature 21a does not have a geometrically similar profile of the original main feature 21a because of the optical proximity effect even when the main feature 21a is projected onto the silicon wafer. For this reason, the projected image having the same profile as the device pattern cannot be obtained even if the pattern being obtained simply by similarly extending the device pattern is used as the main feature 21a.

Therefore, in step S3, the projected image of the main feature 21a is made equal to the device pattern by correcting the design data $D_1$ of the main feature 21a, in view of such optical proximity effect. This process is also called the optical proximity correction.

Also, in step S3, the design data $D_2$, $D_3$ of the first and second assist features 21b, 21c explained in the first embodiment are acquired. The design data $D_2$, $D_3$ include the profile data and position data of the first and second assist features 21b, 21c, for example.

Here, details of step S3 will be explained later with reference to FIG. 23.

After the optical proximity correction is executed as described above, the process goes to step S4. In the step S4, it is decided whether or not the correction of the design data $D_1$ of the main feature 21a is suitable to obtain the projected image that corresponds to the device pattern.

Then, in step S4, if it is decided that the correction is not suitable (NO), the process goes to step S9, where the correction parameter of the optical proximity correction is modified.

On the other hand, in step S4, if it is decided that the correction is suitable (YES), the process goes to step S5.

Figure 24A:
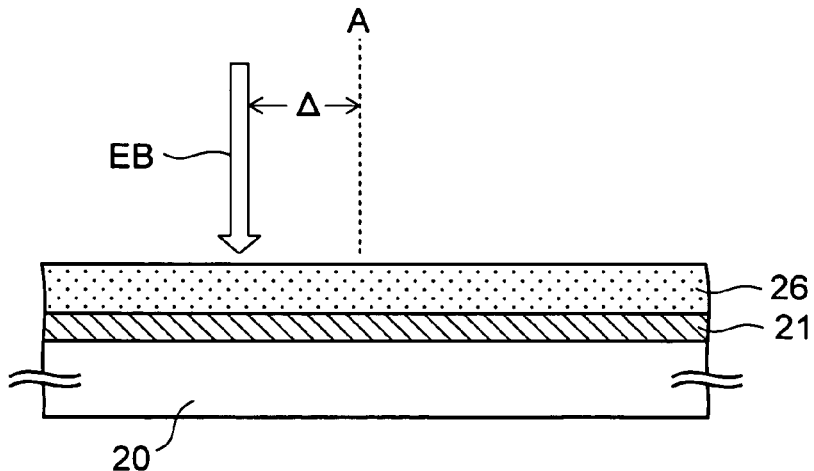
FIGS. 24A to 24D are sectional views showing the exposure mask according to the third embodiment of the present invention in the middle of manufacture.

In step S5, as shown in FIG. 24A, an electron beam resist 26 is coated on the film 21 formed on the quartz substrate 20, then the quartz substrate 20 is put into the electron beam exposure equipment (not shown), and then the design data $D_1$ to $D_3$ are input into a control system of the electron beam exposure equipment. In the electron beam exposure equipment, an amount of deflection Δ of an electron beam EB from an optical axis A is calculated based on respective design data $D_1$ to $D_3$, and then the electron beam resist 26 is exposed by the deflected electron beam EB.

Here, the film 21 is not particularly limited. The light shielding film such as a chromium layer, or the like is formed as the film 21 by the sputter method when the binary mask is to be manufactured as the exposure mask, while a semitransparent layer such as a molybdenum silicide layer, or the like is formed as the film 21 when the halftone mask is to be manufactured.

Figure 24B:
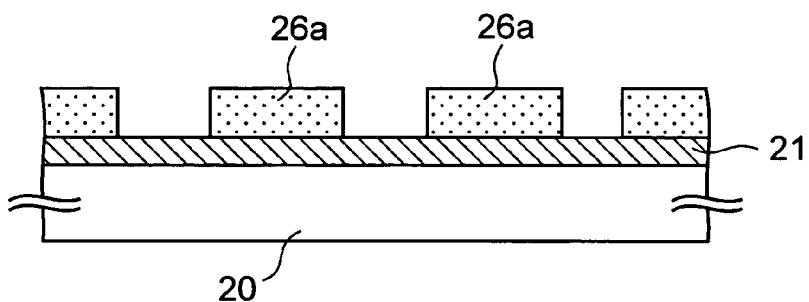

Then, as shown in FIG. 24B, resist patterns 26a are formed by developing the electron beam resist 26 after the exposure using the electron beam EB is completed.

After the resist patterns 26a are formed in this manner, the process goes to step S6 in FIG. 22.

In step S6, a line width of the resist pattern 26a is measured by using the length measuring machine such as CD-SEM, or the like, for example, and then it is decided whether or not the measured value is within a standard value.

Here, if it is decided that the measured value is not within the standard value (NO), the process goes to step S10, where exposure conditions of the electron beam exposure equipment are changed such that the line width of the resist pattern 26a falls within the standard value.

Here, if it is decided that it is impossible to make the line width fall within the standard value only by changing the exposure conditions, the process goes to step S9. In the step S9, the line width of the resist pattern 26a is made to fall within the standard value by modifying the correction parameter of the optical proximity correction.

In contrast, if it is decided that it is impossible to make the line fall width within the standard value only by changing the exposure conditions, the process goes to step S5 again, where the resist patterns 26a are formed on the new quartz substrate 20 and the film 21.

On the contrary, in step S6, if it is decided that the line width of the resist pattern 26a fall within the standard value (YES), the process goes to step S7.

Figure 24C:
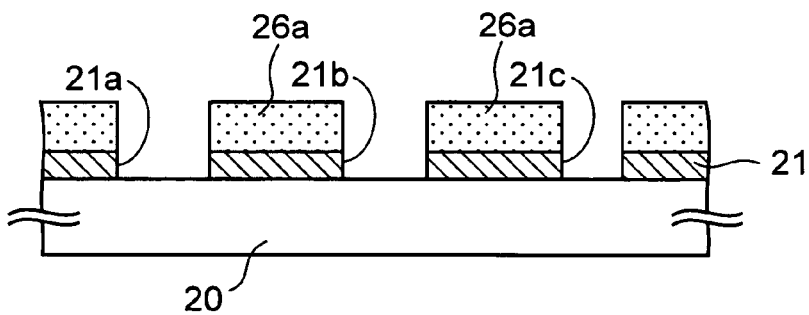

In step S7, as shown in FIG. 24C, the main feature (main opening) 21a and the first and second assist features (assist openings) 21b, 21c are formed by etching the film 21 while using the resist patterns 26a as a mask.

Figure 24D:
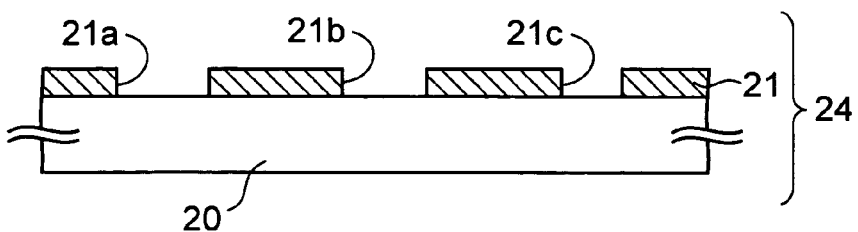

Then, as shown in FIG. 24D, the resist pattern 26a is removed, thereby forming the fundamental structure of the exposure mask 24 explained in the first embodiment.

Figure 25A:
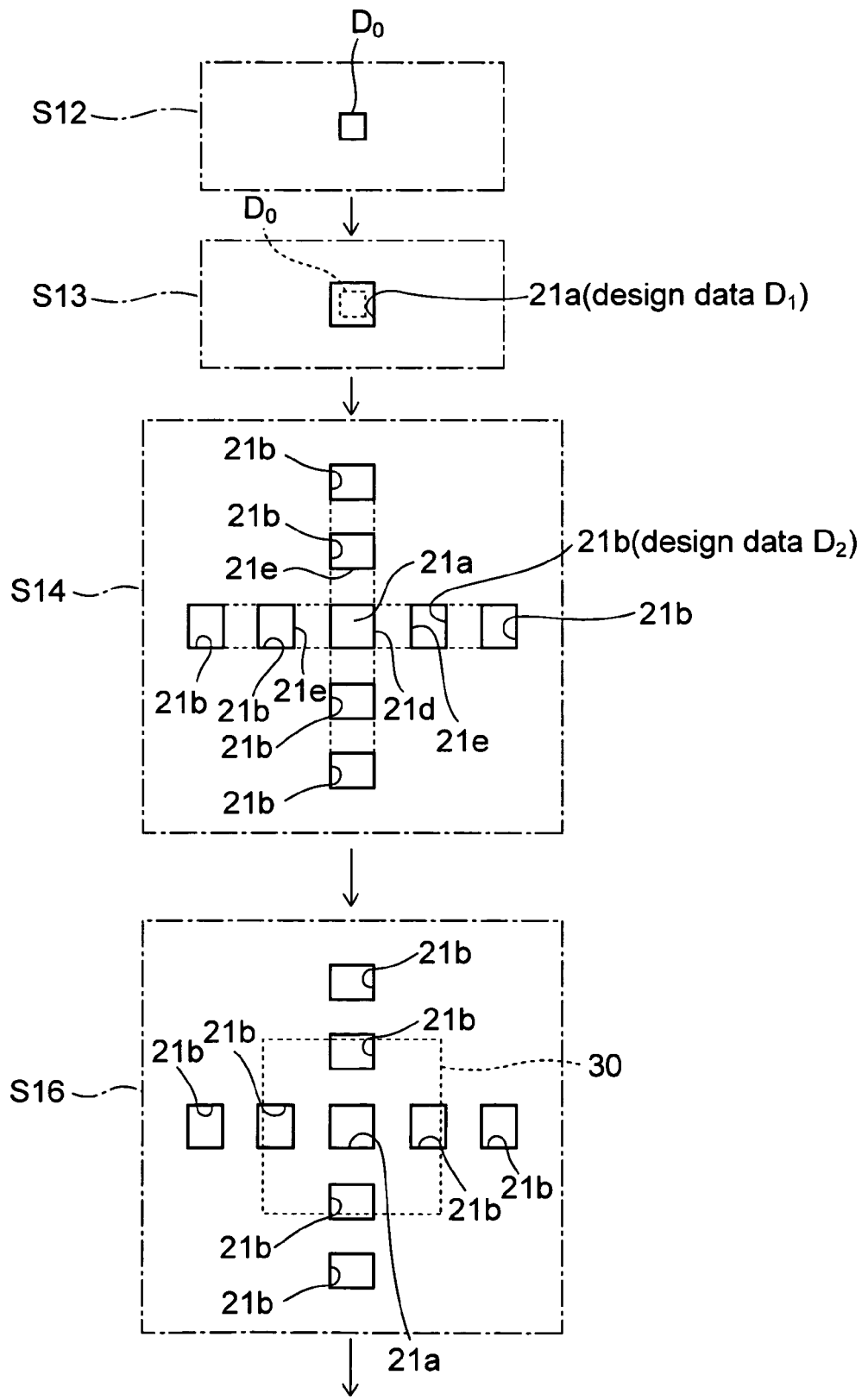
FIGS. 25A and 25B are plan views showing schematically step S3 in the flowchart in FIG. 22.
Figure 25B:
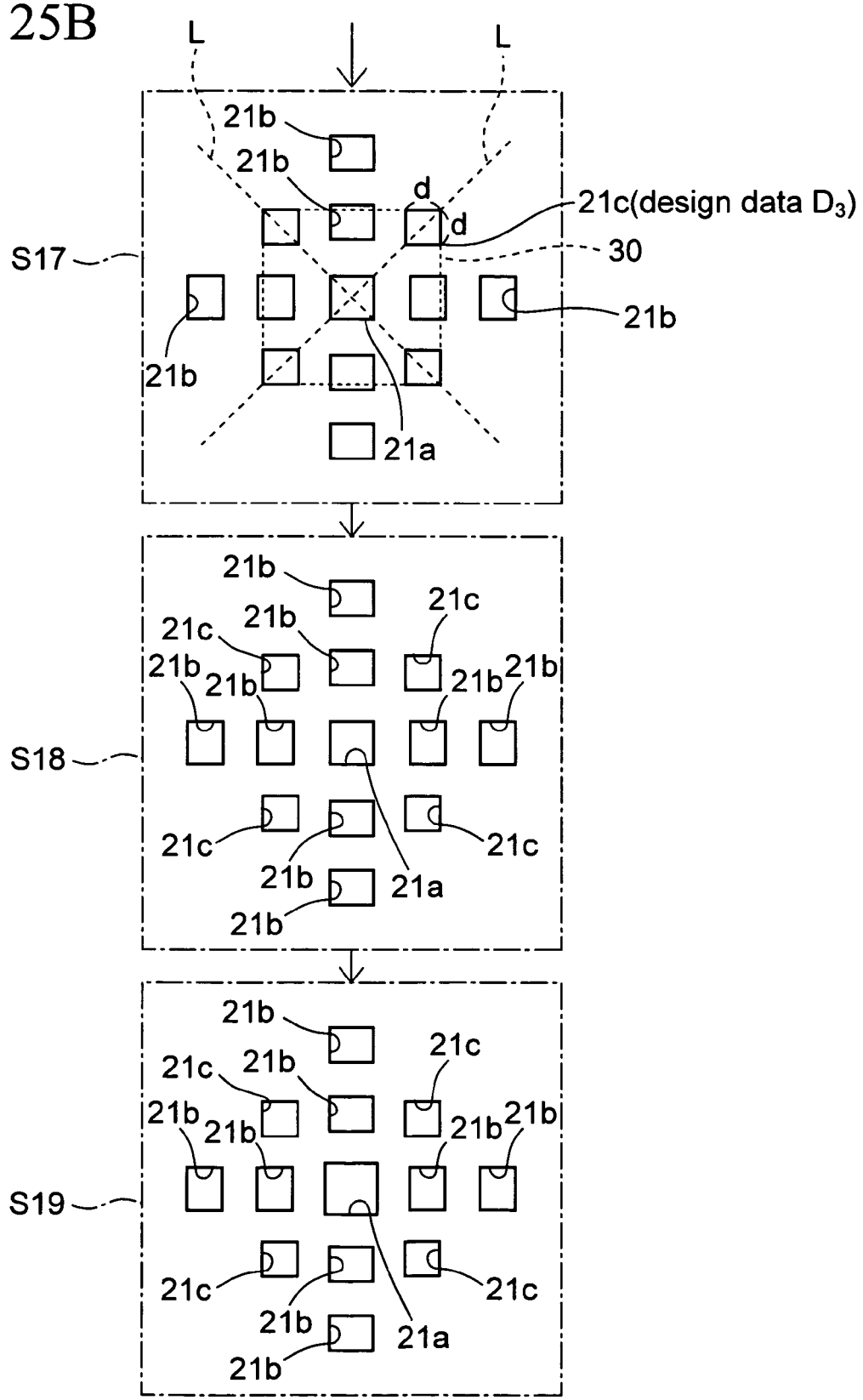

Next, details in step S3 explained above will be explained with reference to FIG. 23 hereunder. Here, FIG. 25A and FIG. 25B are also referred to in the following explanation. FIGS. 25A and 25B are plan views schematically showing main steps in step S3 in the flowchart in FIG. 22. It should be noted that the features 21a to 21c are identified as the corresponding design data $D_1$ to $D_3$ in FIGS. 25A and 25B for making explanation easy.

First, in step S11 in FIG. 23, the initial process of the design data $D_0$ of the device pattern is carried out. Then, the process goes to step S12, and the design data $D_0$ of the target rectangular device pattern is extracted (see FIG. 25A).

Then, the process goes to step S13. In step S13, as schematically shown in FIG. 25A, the design data $D_1$ of the main feature 21a is acquired by applying the process, which extends four sides of the device pattern, to the design data $D_0$ of the rectangular device pattern. Such process is also called the pre-bias process in the following.

Then, as schematically shown in step S14 of FIG. 25A, the design data $D_2$ of the first assist feature 21b is acquired. As shown in FIG. 25A, the first assist feature 21b has the long side 21e, which has the same length as the one side 21d and lie in parallel with the one side 21d, at the position where the one side 21d of the main feature 21a opposes, the one side 21d being extended in the step S13. In the present embodiment, two first assist features 21b are formed beside each four sides of the main feature 21a at a distance from each other, to the direction where the features 21b go away from the main feature 21a.

Then, the process goes to step S15 in FIG. 23. In the step S15, it is checked whether or not some of projected images of the main feature 21a and the first assist features 21b make contact with each other.

Then, if it is decided that some projected images make contact (YES), the process goes back to above step S14. In the step S14, the design data $D_2$ of the first assist feature 21b, which causes the projected images not to contact mutually, is acquired by extending the interval between the features 21a, 21b.

In contrast, in step S15, if it is decided that none of projected images makes contact (NO), the process goes to step S16.

In step S16, as shown schematically in FIG. 25A, a rectangular frame 30, whose center is located in the main feature 21a and whose size can be modified, is formed.

Then, the process goes to step S17 in FIG. 25B. A small rectangle that has one vertex in common with the rectangular frame 30 is arranged in the inner side of the rectangular frame 30, and position data and profile data of the small rectangle are used as the design data $D_3$ of the second assist feature 21c. The second assist feature 21c arranged in this manner is positioned on the virtual prolonged line L of the diagonal of the main feature 21a, as described in the first embodiment.

Also, in step S17, a size of the small rectangle can be modified by arbitrarily specifying a distance d from one vertex of the rectangular frame 30. Among many small rectangular of various size thus obtained, it is preferable to select the largest one, which is not resolved and can make the depth of focus of the exposure mask be deepest, as the second assist feature 21c.

Also, the position of the second assist feature 21c is determined by the vertex of the rectangular frame 30 formed in step S16. In the present embodiment, since a size of the rectangular frame 30 can be modified, the position of the second assist feature 21c can arbitrarily be specified. Therefore, this second assist feature 21c can be arranged in the position where the depth of focus of the main feature 21a is made deepest.

Then, the process goes to step S18 in FIG. 23. In the step S18, it is checked whether or not some of projected images of the main feature 21a and the first and second assist features 21b, 21c make contact with each other.

If it is decided that some projected images make contact mutually (NO), the process goes back to step S16. In the step S16, the size of the rectangular frame 30 is modified, thereby preventing the projected images from contacting with each other.

On the other hand, if it is decided that none of projected images makes contact (YES) in step S18, the process goes to step S19.

In step S19, as shown schematically in FIG. 25B, the OPC process is applied to the main feature 21a such that the projected image of the main feature 21a coincides with the planar shape of the target device pattern. In the example of FIG. 25B, four sides of the main feature 21a are extended by the OPC process. This OPC process is applied only to the main feature 21a, and the OPC process is not applied to the first and second assist features 21b, 21c.

Then, the process goes to step S20. In the step S20, it is decided whether or not the design data $D_1$ to $D_3$ of the features 21a to 21c can ensure the size in the actual manufacturing steps of the exposure mask (step S7 in FIG. 22) and whether or not such design data $D_1$ to $D_3$ can give a desired resist size by the exposure.

Then, if it is decided as NO in step S20, the process goes back to step S19, where the OPC process is applied to the main feature 21a once again.

In contrast, if it is decided as YES in step S20, the process goes to step S21. In the step S21, design data $D_1$ to $D_3$ of the main feature 21a and the first and second assist features 21b, 21c are extracted, thereby completing a series of the above processes.

According to the present embodiment explained as above, the design data $D_0$ of the device pattern is processed such that four sides of the device pattern are extended, as in step S13 (pre-bias process) in FIG. 25A. Therefore, in subsequent step S14, the long side 21e of the first assist feature 21b can be generated on the basis of the extended side, and also the design data $D_2$ of the first assist feature 21b having the rectangle, which is advantageous in increasing the depth of focus of the exposure mask, can be obtained easily.

Furthermore, in step S17, the size of the small rectangle serving as the second assist feature 21c is made to be modified. Therefore, it is made possible to, among many small rectangles of various sizes, select a small rectangle that can mostly deepen the depth of focus of the exposure mask as the second assist feature 21c.

In addition, as explained in step S17 in FIG. 25B, the rectangular frame 30, whose size can be modified, is formed and then a small rectangle 31 is arranged at four corners of the rectangular frame 30. Accordingly, the second assist feature 21c can be arranged in any position on the virtual prolonged line L of the diagonal of the main feature 21a based on the small rectangle 31. Therefore, the second assist feature 21c can be formed in the position, in which the depth of focus of the main feature 21a can be deepened mostly, among various positions on the virtual prolonged line L, and also an effect of deepening the depth of focus by using the second assist feature 21c can maximally be achieved.

In contrast to the present embodiment, for example, if the method of arranging the first and second assist features 21b, 21c only on predetermined lattice points on the exposure mask is employed, a positional margin of the second assist feature 21c is reduced smaller than the present embodiment. Therefore, it is difficult to arrange the second assist feature 21c in the position in which the depth of focus can be deepened mostly as described above.

(5) Fourth Embodiment

In this embodiment, a semiconductor device manufacturing method using the exposure mask 24 (see FIG. 10) explained in the first embodiment will be explained hereunder.

Figure 26:
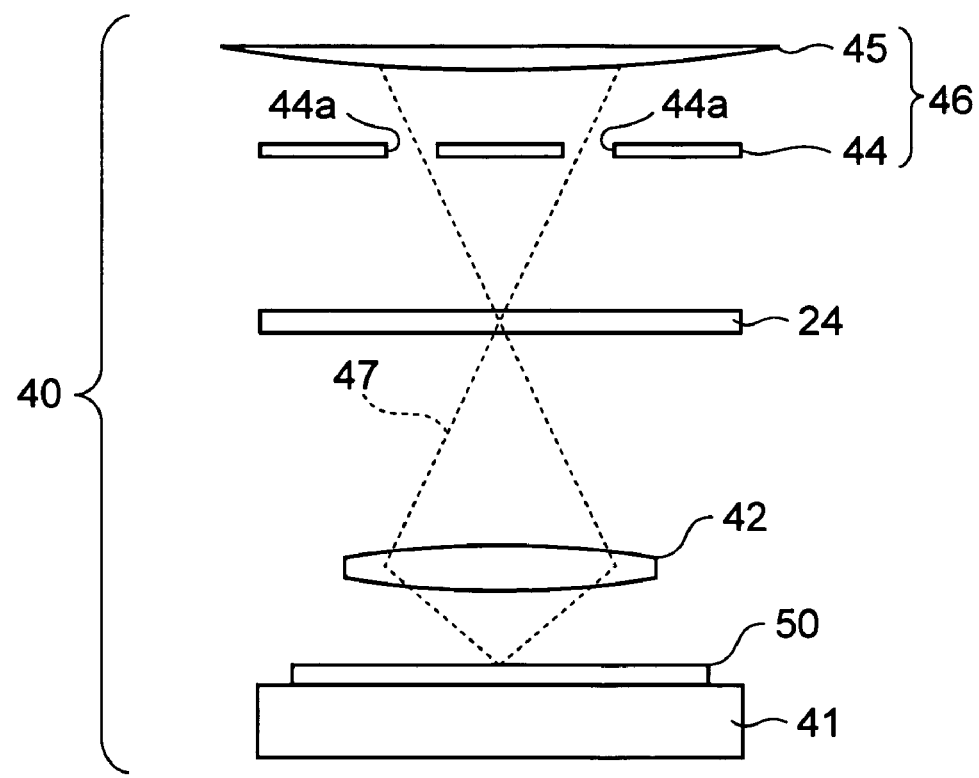
FIG. 26 is a configurative view of an exposure equipment used in a semiconductor device manufacturing method according to a fourth embodiment of the present invention.

FIG. 26 is a configurative view of an exposure equipment used in the steps of manufacturing the semiconductor device.

An exposure equipment 40 is constructed by arranging a projection lens 42, the exposure mask 24, and an illumination system 46 over a substrate loading table 41, on which a silicon (semiconductor) substrate 50 is loaded, in this order. The illumination system 46 consists of a diaphragm 44 and a light source 45, and a KrF excimer laser source, for example, is employed as the light source 45. Also, as the diaphragm 44, a annular illumination diaphragm having a circular slit 44a around an optical axis is employed, and accordingly the illumination system 46 provides a modified illumination system.

Here, in order to attain effectively an increase of the depth of focus, preferably the above modified illumination system should be employed as the illumination system 46. But the present invention is not limited to this, and the normal illumination system may be employed as the illumination system 46.

In addition, the light source 45 is not limited to the KrF excimer laser source. An ArF excimer laser source for generating the ArF light having a shorter wavelength than the KrF light may be employed. Further, an immersion type ArF exposure equipment, which enhances the NA (numerical aperture) of the projection lens 42 by filling a liquid such as a water, or the like in a space between the silicon substrate 50 and the projection lens 42, may be employed as the exposure equipment 40. In that case, the resolving power of the exposure equipment 40 can be increased much more if the halftone mask is used as the exposure mask 24.

In the present embodiment, the semiconductor device is manufactured by using the above exposure equipment 40 as follows.

FIGS. 27A to 27E are sectional views showing the semiconductor device according to the present embodiment in the middle of manufacture.

Figure 27A:
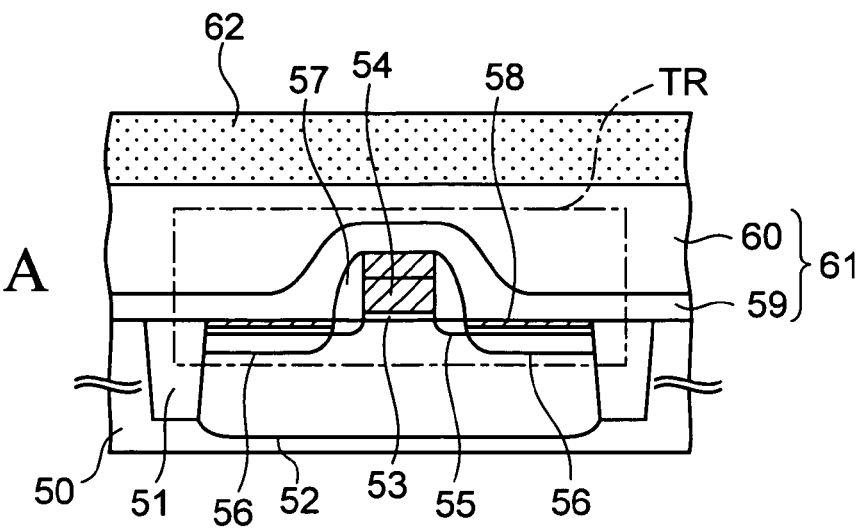
FIGS. 27A to 27E are sectional views showing the semiconductor device according to a fourth embodiment of the present invention in the middle of manufacture.

At first, steps required until a sectional structure shown in FIG. 27A is obtained will be explained hereunder.

First, an STI (Shallow Trench Isolation) trench is formed in the silicon substrate 50, and an element isolation insulating film 51 is formed by filling a silicon oxide film in this trench. Then, a p-type impurity such as boron, or the like, for example, is ion-implanted into an active region of the silicon substrate 50, which is defined by the element isolation insulating film 51. Thus, a p-well 52 is formed.

Then, a gate insulating film 53 is formed by thermally oxidizing a surface of the active region of the silicon substrate 50. Then, a gate electrode 54 made of polysilicon is formed thereon. Then, an n-type source/drain extension 55 is formed by ion-implanting an n-type impurity such as phosphorus, or the like into a surface layer of the silicon substrate 50, while using the gate electrode as a mask.

Then, an insulating film such as a silicon oxide film, or the like is formed on overall upper surface of the silicon substrate 50 by the CVD method. Then, insulating sidewalls 57 are left beside the gate electrode 54 by etching back the insulating film. Then, the n-type impurity such as phosphorus, or the like is ion-implanted into the silicon substrate 50 again, while using the insulating sidewalls 57 and the gate electrode 54 as a mask. Thus, an n-type source/drain region 56 is formed on the silicon substrate 50 on both sides of the gate electrode 54.

Then, a refractory metal layer such as a cobalt layer, or the like is formed on an overall upper surface of the silicon substrate 50 by the sputter method. Then, a refractory metal silicide layer 58 is formed by the annealing to cause the refractory metal layer react with the silicon. Then, the unreacted refractory metal layer on the element isolation insulating film 51, and the like is removed by the wet etching.

A basic structure of an n-type MOS transistor TR constructed by the gate insulating film 53, the gate electrode 54, the n-type source/drain regions 56, and the like is completed by the steps applied up to now.

Then, a silicon nitride film 59 and a silicon oxide film 60 are formed in this order on the overall upper surface of the silicon substrate 50 by the CVD method, and these stacked films 59, 60 are used as an interlayer insulating film (device pattern film) 61.

Then, a chemically amplified positive photoresist 62 is coated on the interlayer insulating film 61 by the spin coating method. Here, prior to the coating of this photoresist 62, TARC (Top Side Antireflective Coating) may be coated in advance on the interlayer insulating film 61 as the reflection preventing film that prevents the reflection of the exposure light.

Figure 27B:
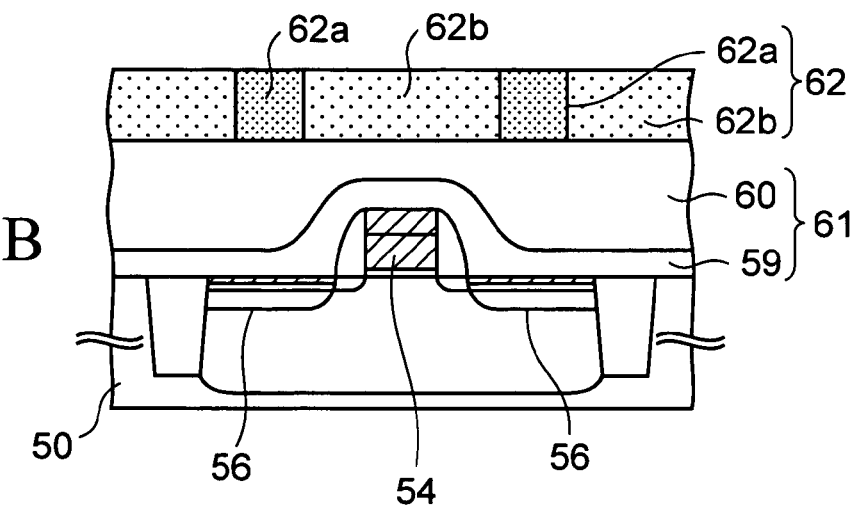

Next, steps required until a sectional structure shown in FIG. 27B is obtained will be explained hereunder.

First, the silicon substrate 50 on which the photoresist 62 is coated as above is put on the substrate loading table 41 of the exposure equipment 40 explained in FIG. 26. Then, an exposure light 47 generated from the light source 45 is passed through the exposure mask 24, and then the exposure light 47 is converged onto the silicon substrate 50 by the projection lens 42 to expose the photoresist 62.

Accordingly, as shown in FIG. 27B, the photoresist 62 in an area onto which the exposure light 47 is irradiated constitutes a sensitive portion 62a of the planar shape corresponding to the main feature 21a of the exposure mask 24, while the photoresist 62 in an area onto which the exposure light 47 is not irradiated constitutes a non-sensitive portion 62b.

Then, the photoresist 62 is baked. This baking is also called PEB (Post Exposure Baking), and is applied to accelerate acid generation in the sensitive portion 62a.

Figure 27C:
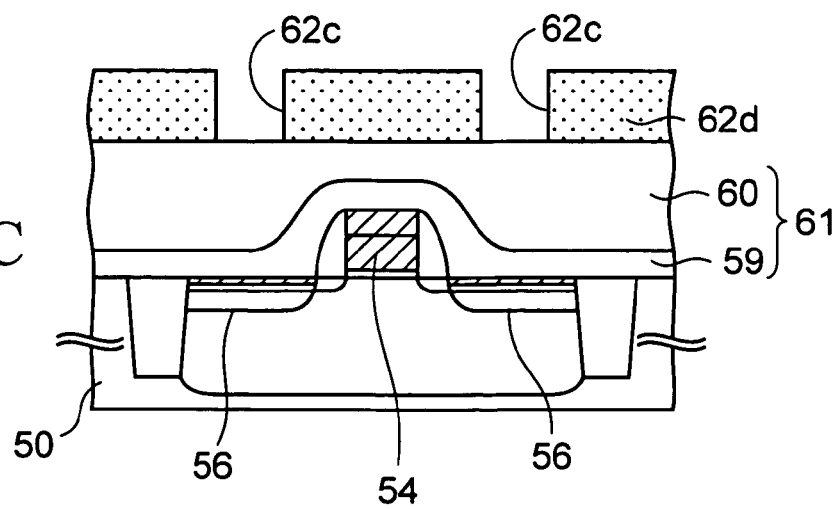

Then, as shown in FIG. 27C, the sensitive portions 62a in which the acid still remains are removed by developing the photoresist 62 to form hole-like windows 62c, and also the remaining non-sensitive portions 62b constitute resist patterns 62d.

Figure 27D:
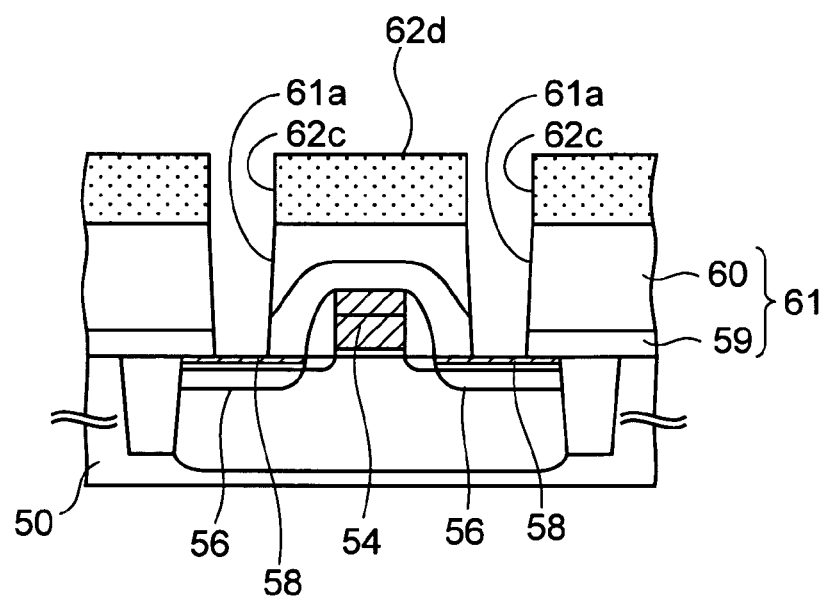

Then, as shown in FIG. 27D, the dry etching is applied to the interlayer insulating film 61 by using the resist patterns 62d as a mask. Thus, contact holes (device patterns) 61a each reaching the refractory metal silicide layer 58 are formed in the interlayer insulating film 61.

After this etching, the resist patterns 62d are removed.

Figure 27E:
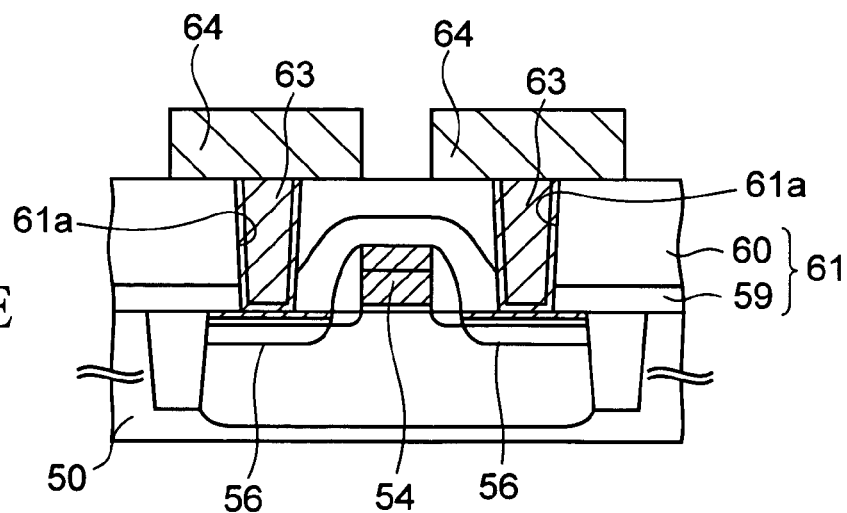

Next, steps required until a sectional structure shown in FIG. 27E is obtained will be explained hereunder.

First, a film having a role as a glue film is formed on inner surfaces of the contact holes 61a and an upper surface of the interlayer insulating film 61 by the sputter method. Normally a titanium nitride (TiN) film, or the like is employed as this film. Then, a tungsten film is formed on the glue film by the CVD method, so that the contact holes 61a are filled completely with this tungsten film. The extra tungsten film and the glue film formed on the interlayer insulating film 61 are polished by the CMP (Chemical Mechanical Polishing) method to remove. Thus, these films are left in the contact holes 61a as a conductive plug 63.

Then, a metal stacked film containing an aluminum film is formed on the conductive plugs 63 and the interlayer insulating film 61 by the sputter method respectively. Then, metal wiring patterns 64 are formed by patterning the metal stacked film by virtue of the photolithography.

With the above, main steps in the semiconductor device manufacturing method according to the present embodiment are ended.

According to the present embodiment, in the steps explained in FIG. 27B, the photoresist 62 is exposed by using the exposure mask 24 (see FIG. 10) explained in the first embodiment. The exposure mask 24 is constructed by arranging the first and second assist features 21b, 21c around the main feature 21a, as shown in FIG. 10, and accordingly the depth of focus of the coarse main feature 21a can be increased.

Therefore, in the situation that the defocus is generated by an error in the exposure equipment 40 shown in FIG. 26 or the warp of the silicon substrate 50 is generated, for example, it can be suppressed that a size of the window 62c of the resist pattern 62d in FIG. 27C is varied owing to the defocus. As a result, it can be prevented that a diameter of the contact hole 61a is deviated largely from the design value in the etching step shown in FIG. 27D, and thus it can be prevented that the finally resultant semiconductor device becomes defective.

According to the present invention, the first assist features having the rectangular shape are formed beside the main feature of the exposure mask, and also the second assist feature is formed in the position that is oblique to the main feature. Therefore, the exposure mask the depth of focus of which can be deepened rather than the prior art can be provided.

Besides, when the semiconductor device is manufactured by using such exposure mask, it can be prevented that a size of the device pattern is wrong largely from the design value, and also it can be prevented beforehand that the semiconductor device becomes defective.

What is claimed is:

1. An exposure mask, comprising:
a transparent substrate;

a film formed on the transparent substrate;
a rectangular main feature formed in the film;
a first assist feature formed in the film at a distance from the main feature, the first assist feature being rectangular shape having a long side opposing to one side of the main feature and having a size that is not resolved as a device pattern; and
a second assist feature formed in the film and positioned on a virtual prolonged line of a diagonal of the main feature, and having a size that is not resolved as a device pattern,
wherein the long side of the first assist feature has substantially a same length as the one side of the main feature, and
the main feature, the first assist feature, and the second assist feature transmit an exposure light, wherein the first assist feature is formed in twos at a distance in a direction from the main feature.

2. An exposure mask according to claim 1, wherein the main feature is formed in plural, and an interval between two projected images out of plural main features is three times or more a width of the projected image.

3. An exposure mask according to claim 1, wherein the main feature is formed repeatedly in plural in a row direction and a column direction in a partial region of the transparent substrate, an interval between projected images out of plural main features is below three times a width of the projected image, the first assist feature is formed in plural to oppose to the main features on an outermost periphery respectively, and the second assist feature is formed on a virtual prolonged line of a diagonal of the main feature located at a corner portion of the partial region.

4. An exposure mask according to claim 3, wherein another main feature is formed on the virtual prolonged line on an outside of the partial region, and the first assist feature is formed on the virtual prolonged line between another main feature and the main feature located at the corner portion.

5. An exposure mask according to claim 1, wherein the film is formed of a light shielding film or a semitransparent film.

6. An exposure mask manufacturing method, comprising:
acquiring design data of a main feature by applying a process, which extends four sides of a rectangular device pattern, to design data of the device pattern;
acquiring design data of a first assist feature with a rectangular shape that has a long side, which is located in parallel with one side of the main feature and has a same length as the one side, in a position opposing to the one side;
acquiring design data of a second assist feature that is positioned on a virtual prolonged line of a diagonal of the main feature;
forming the main feature, the first assist feature, and the second assist feature in a light shielding film on a transparent substrate respectively by patterning the light shielding film by means of a lithography using design data of the main feature, the first assist feature, and the second assist feature, wherein the first assist feature has a size that is not resolved as the device pattern;
passing an exposure light through the main feature, an exposure light through the first assist feature, and an exposure light through the second assist feature, wherein the exposure lights have substantially a same phase.

7. An exposure mask manufacturing method, according to claim 6, wherein the acquiring the design data of a second assist feature includes
forming a rectangular frame whose center is located in the main feature, and
arranging a small rectangle, which has one vertex in common with the rectangular frame, in an inner side of the rectangular frame and then acquiring position data and shape data of the small rectangle as the design data of the second assist feature.

8. An exposure mask manufacturing method, according to claim 7, wherein, upon arranging the small rectangle in the inner side of the rectangular frame, a size of the small rectangle is allowed to be modified.

9. An exposure mask manufacturing method, according to claim 8, further comprising:
checking whether or not some of projected images of the main feature, the first assist feature, and the second assist feature make contact with each other, after design data of the first assist feature and the second assist feature are acquired.

10. A semiconductor device manufacturing method, comprising:
forming a device pattern film on a semiconductor substrate;
coating a photoresist on the device pattern film;
exposing the photoresist by using an exposure mask, the exposure mask being composed of a transparent substrate, a film formed on the transparent substrate, a rectangular main feature formed in the film, a first assist feature formed in the film at a distance from the main feature and being rectangular shape having a long side opposing to one side of the main feature and having a size that is not resolved as a device pattern, and a second assist feature formed in the film and positioned on a virtual prolonged line of a diagonal of the main feature and having a size that is not resolved as a device pattern;
forming a resist pattern by developing the photoresist after the exposure; and
forming a device pattern by patterning the device pattern film, by etching the device pattern film while using the resist pattern as a mask,
wherein the long side of the first assist feature has substantially a same length as the one side of the main feature, and
the main feature, the first assist feature, and the second assist feature transmit an exposure light, wherein the first assist feature is formed in twos at a distance in a direction from the main feature.

11. A semiconductor device manufacturing method, according to claim 10, wherein a modified illumination is used upon exposing the photoresist.

* * * * *